United States Patent
Nozawa

(10) Patent No.: US 8,724,132 B2
(45) Date of Patent: May 13, 2014

(54) IMAGE PROCESSING APPARATUS, METHOD OF CONTROLLING IMAGE PROCESSING APPARATUS AND INFORMATION RECORDING MEDIUM

(75) Inventor: Takumi Nozawa, Kanagawa (JP)

(73) Assignee: Ricoh Company, Ltd., Tokyo (JP)

( * ) Notice: Subject to any disclaimer, the term of this patent is extended or adjusted under 35 U.S.C. 154(b) by 360 days.

(21) Appl. No.: 13/083,938

(22) Filed: Apr. 11, 2011

(65) Prior Publication Data

US 2011/0286027 A1 Nov. 24, 2011

(30) Foreign Application Priority Data

May 24, 2010 (JP) ................................ 2010-118600
Feb. 21, 2011 (JP) ................................ 2011-034071

(51) Int. Cl.
*G06K 15/00* (2006.01)
*G06F 17/50* (2006.01)
*G01R 21/133* (2006.01)

(52) U.S. Cl.
CPC .......... *G06F 17/5036* (2013.01); *G01R 21/133* (2013.01)
USPC .......................................... 358/1.14; 702/57

(58) Field of Classification Search
USPC ...................... 358/1.9; 323/299; 700/28, 105; 702/163, 176, 57, 60, 61
See application file for complete search history.

(56) References Cited

U.S. PATENT DOCUMENTS

| | | | |
|---|---|---|---|
| 5,325,209 A | 6/1994 | Manabe | |
| 2004/0098222 A1* | 5/2004 | Pehrsson et al. | 702/176 |
| 2004/0268168 A1* | 12/2004 | Stanley et al. | 713/320 |
| 2005/0107892 A1* | 5/2005 | Matsui et al. | 700/28 |
| 2005/0207777 A1 | 9/2005 | Takahashi et al. | |
| 2010/0171751 A1* | 7/2010 | Kim | 345/589 |
| 2011/0231000 A1* | 9/2011 | Higashi et al. | 700/105 |

FOREIGN PATENT DOCUMENTS

| | | | | |
|---|---|---|---|---|
| JP | 2005-103868 | | 4/2005 | |
| JP | 2007-106079 | | 4/2007 | |
| WO | WO2010061524 | * | 6/2010 | ............. H05K 13/08 |

OTHER PUBLICATIONS

Nov. 22, 2011 European search report in connection with counterpart European patent application No. 11 16 2083.

* cited by examiner

*Primary Examiner* — Jerome Grant, II
(74) *Attorney, Agent, or Firm* — Cooper & Dunham LLP

(57) ABSTRACT

An image processing apparatus includes an action part that processes an image; a user interface part; a power measurement part that measures power consumed by the image processing apparatus; and a control part that controls the action part and the user interface part, and controls power supply to the action part and the power measurement part. The control part obtains information of the power measured by the power measurement part and displays the information on the user interface part.

13 Claims, 15 Drawing Sheets

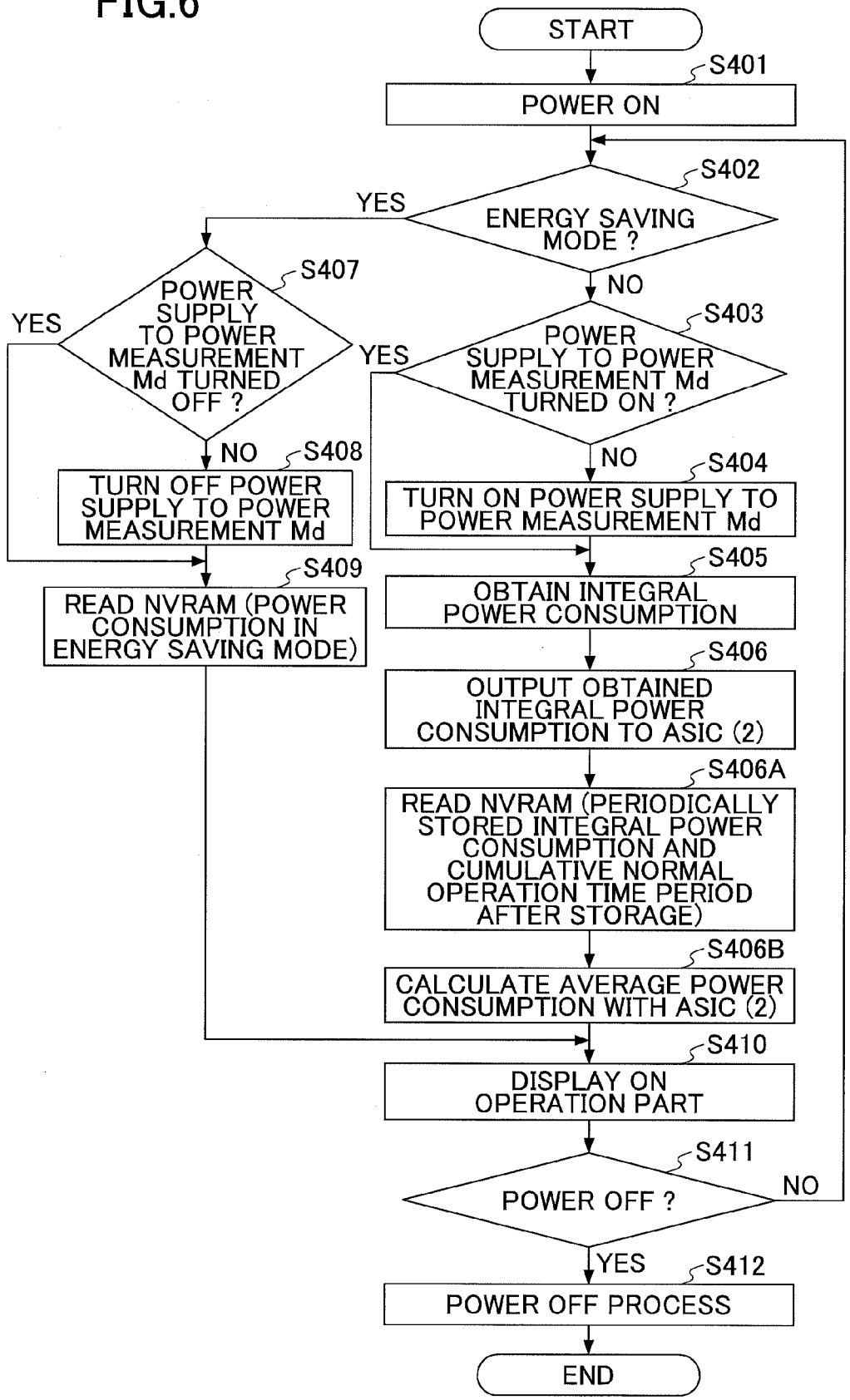

FIG.8

| AVERAGE POWER CONSUMPTION | POWER CONSUMPTION MEASUREMENT MODE ON/OFF |
|---|---|
| 0 THROUGH XXW | ON |
| XXW THROUGH | OFF |

FIG.10

| AVERAGE POWER CONSUMPTION | ENERGY SAVING ENTERING TIME PERIOD |
|---|---|
| 0 THROUGH XXW | 5 MINUTES |
| XXW THROUGH | 1 MINUTE |

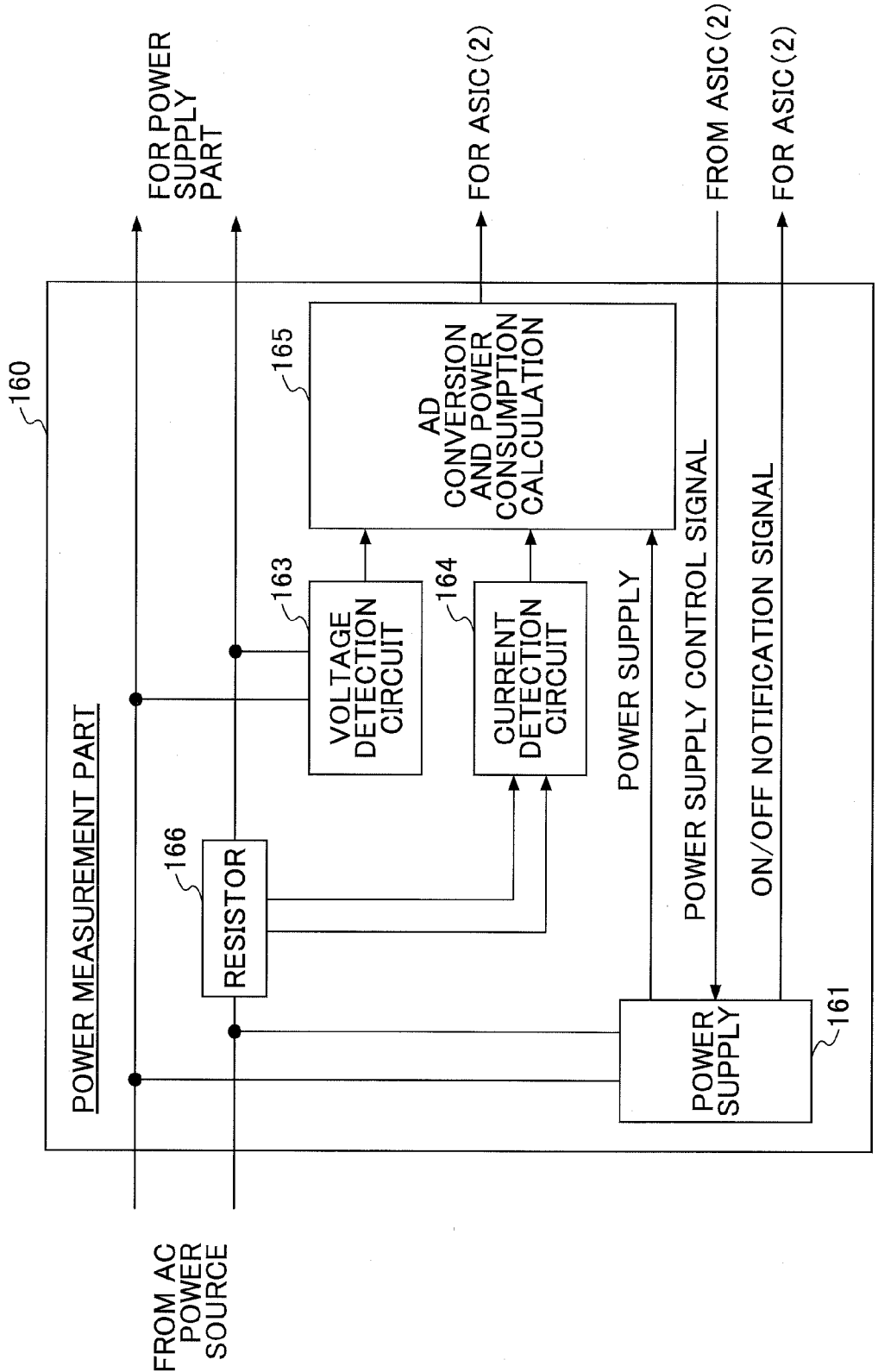

IMAGE PROCESSING APPARATUS, METHOD OF CONTROLLING IMAGE PROCESSING APPARATUS AND INFORMATION RECORDING MEDIUM

BACKGROUND OF THE INVENTION

1. Field of the Invention

The present invention relates to an image processing apparatus, such as a copier, a printer or a multifunction peripheral, in which power saving operations can be carried out, a method of controlling the image processing apparatus and a recording medium that stores a program for controlling the image processing apparatus. In more detail, the present invention relates to an image processing apparatus that has a power measurement part, measures power consumption in normal operation of the image processing apparatus by using the power measurement part, and makes it possible that a user can monitor a state of the power consumption, a method of controlling the image processing apparatus and a recording medium that stores a program for controlling the image processing apparatus.

2. Description of the Related Art

Recently, for an image processing apparatus, such as a copier, a printer or a multifunction peripheral, which carries out a process of outputting (or printing) an image based on image data that is input through a scanner or a communication part, power saving is required because of escalation of interest in the environment, and a power saving operation is carried out in which, during a standby state, power supply other than minimum necessary power supply is stopped, and thus, power consumption is reduced. It is noted that generally speaking, the term "energy saving" is used as including "power saving", and in the specification, "energy saving" means "power saving".

A method has been proposed to achieve power saving in which a wattmeter is provided to measure power that is supplied from an AC (Alternating Current) power source that supplies power to an image processing apparatus or such, which carries out power saving, and the power saving is carried out according to the measurement result of the wattmeter.

Patent Document 1 (Japanese Laid-Open Patent Application No. 2007-106079) is a document that discloses one example of such related art. In the related art, a wattmeter is provided for measuring power supplied from an AC power source that is common to an image input/output apparatus such as a copier for which power saving is carried out and respective system elements, i.e., a server, a network hub and a PC (Personal Computer), which are connected, via a communication network, with the image input/output apparatus. By using the wattmeter, power consumption is measured via the communication network, and based on the measurement result of the wattmeter, the image input/output apparatus switches from power supply carried out from an AC power source for a case of high load to power supply carried out from the network hub or PC for which power supply from a DC (Direct Current) power source having higher conversion efficiency is available through an external network, for a case of low load. Thus, reduction in power consumption is attempted.

However, in the method of Patent Document 1, the wattmeter is connected to an AC power supply line that is common to the image input/output apparatus, the server, the network hub and the PC, and thus, it is not possible to accurately measure power consumption of the image input/output apparatus itself for which power consumption is to be reduced. Further, the measurement result of the power consumption is used merely for switching the power supply, and thus, the user cannot know an effect of the reduction of the power consumption. Thus, it is not possible that the user is aware of power saving. Further, power saving is not considered for power consumed by the wattmeter itself, and thus, power consumption increases by the power consumed by the wattmeter.

SUMMARY OF THE INVENTION

According to an embodiment of the present invention, an image processing apparatus includes an action part that processes an image and a user interface part. The image processing apparatus further includes a power measurement part that measures power consumed by the image processing apparatus and a control part that controls the action part and the user interface part and controls power supply to the action part and the power measurement part. The control part obtains information of the power measured by the power measurement part and displays the obtained information on the user interface part.

According to another embodiment of the present invention, a method of controlling an image processing apparatus, which includes an action part that processes an image, a user interface part, and a power measurement part that measures power consumed by the image processing apparatus, includes controlling power supply to the action part and the power measurement part, and displaying information of the power measured by the power measurement part on the user interface part.

According to yet another embodiment of the present invention, a program is provided for controlling an image processing apparatus that includes an action part that processes an image, a user interface part, and a power measurement part that measures power consumed by the image processing apparatus. The program causes a computer to carry out controlling power supply to the action part and the power measurement part, and displaying information of the power measured by the power measurement part on the user interface part.

Other objects, features and advantages of embodiments of the present invention will become more apparent from the following detailed description when read in conjunction with the accompanying drawings.

BRIEF DESCRIPTION OF THE DRAWINGS

FIG. 6 is a flowchart showing one example of an operation flow in which a process of calculating an average power consumption additionally carried out in the operation flow shown in FIG. 3, according to a third embodiment of the image processing apparatus;

FIG. 8 shows one example of a table used in a step of determining and setting the power consumption measurement mode ON or the power consumption measurement mode OFF carried out in the operation flow of FIG. 7;

FIG. 10 shows one example of an average power consumption—energy saving entering time period table used in a step of determining whether to change the energy saving entering time period in the operation flow of FIG. 9;

FIG. 14 is a block diagram showing an example of a configuration of a power measurement part (power measurement Md) shown in FIG. 1.

DETAILED DESCRIPTION OF THE EMBODIMENTS

Figure 1:
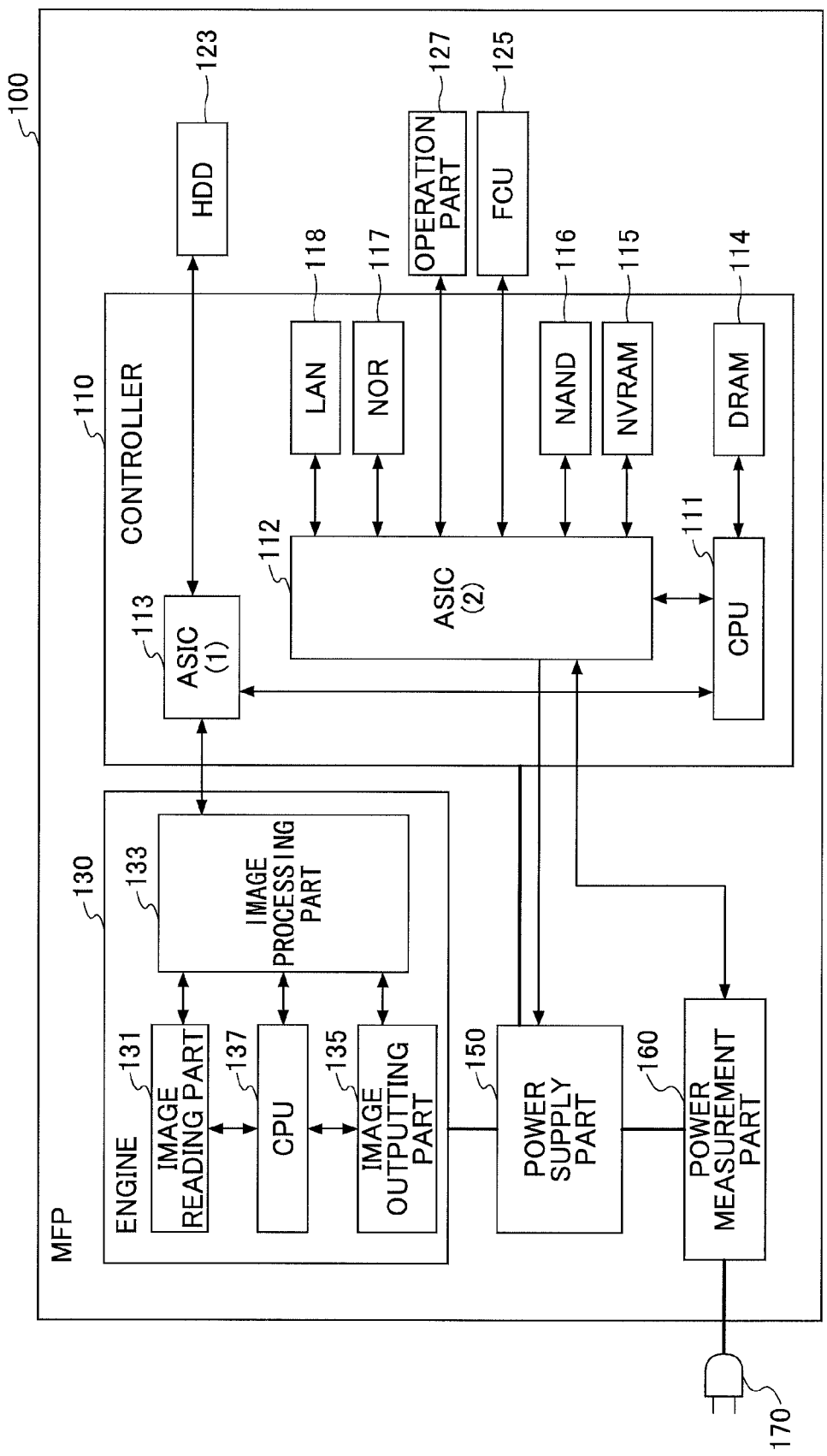
FIG. 1 generally shows one example of a hardware configuration of a MFP (MultiFunction Peripheral) as a first embodiment of an image processing apparatus according to the present invention.

An embodiment of the present invention has been devised in consideration of the above-mentioned problem in the related art, and an object of the embodiment is to provide a configuration in which it is possible to minimize power consumption, and a user can know power consumption with as high accuracy as is necessary, and thus, the user can have awareness for power saving.

According to the embodiment of the present invention, a power measurement part is provided which measures power consumed in an image processing apparatus. The power measured by the power measurement part includes power consumed by the power measurement part itself. The thus-measured power is displayed to the user, and thus, the user can accurately know power consumption and further a degree of power saving. Thus, the user's awareness for power saving can be boosted. Further, in a power saving operation, power supply to the power measurement part may be stopped, power consumed is thus estimated, and the estimated power consumption is displayed to the user. Thereby, it is possible to minimize power consumption even in the configuration in which the power measurement part is provided, and thus, it is possible that the user knows an effect of power saving while avoiding reduction of an advantage of the power saving as much as possible.

With reference to drawings, a first embodiment of an image processing apparatus according to the present invention will now be described in detail.

In the image processing apparatus according to the first embodiment, an energy saving (or power saving) operation can be carried out as a result of turning on and off of power supply to a predetermined action part of respective action parts being controlled. Also, in the image processing apparatus, power consumed by the image processing apparatus can be measured by a power measurement part provided in the image processing apparatus, and the power consumption measured by the power measurement part is displayed on an operation part that functions as a user interface (i.e., one example of a user interface part). Further, the power measurement part itself consumes power when carrying out a power measurement operation, and, in the image processing apparatus, it is also possible to control turning on and off of power supply to the power measurement part itself. Thus, it is possible to stop power supply to the power measurement part in a state in which power measurement is not necessary.

It is preferable that in the image processing apparatus according to the first embodiment, for example, a user interface or a facsimile reception part is always in a standby state, and thus, the image processing apparatus is in such a state that data (i.e., image data or such) can be always input to the image processing apparatus. Further, as the image processing apparatus according to the first embodiment, a MFP is preferable which has various functions, in a combined manner, such as a copy function, a scanner function, a printer function and a facsimile function (including a facsimile reception function and a facsimile transmission function), and consumes high power for image outputting (printing) operations. However, a type of an apparatus is not limited to a MFP as long is the apparatus is an image processing apparatus having such a configuration as that mentioned above.

[Configuration of Image Processing Apparatus (MFP)]

A configuration of the MFP according to the first embodiment having the above-mentioned feature will be described in detail.

FIG. 1 generally shows one example of a hardware configuration of the MFP.

As shown in FIG. 1, the MFP 100 includes an engine 130, a controller 110, a HDD (Hard Disk Drive) 123, an operation part 127, a FCU (Facsimile Control Unit) 125, a power supply part 150 and a power measurement part 160.

The controller 110 controls the entirety of the MFP 100, and the engine 130, the HDD 123, the FCU 125, the operation part 127, the power supply part 150 and the power measurement part 160 operate under the control of the controller 110.

The controller 110 includes a computer that has a CPU (Central Processing Unit) 111 and various memories, i.e., a NAND type flash memory 116, a NV (Non-Volatile) RAM (Random Access Memory) 115, a NOR type flash memory 117 and a DRAM (Dynamic Random Access Memory) 114. A control program, control data and so forth stored in the flash memory or such are used so that the computer is driven, and thus, the controller 110 acts as a control part.

The controller 110 further includes an ASIC (Application Specific Integrated Circuit) (2) 112 that operates under the control of the CPU 111. The ASIC (2) 112 controls the power supply part 150, the power measurement part 160, the operation part 127, the FCU 125, the various memories (i.e., NOR 117, NAND 116 and NVRAM 115) and I/O (i.e., inputting and outputting of data between the respective parts). The controller 110 further includes an ASIC (1) 113 that controls various sorts of image processing such as compression/decompression, and controls the HDD 123 (and/or the nonvolatile memory). Further, the controller 110 has a LAN (Local Area Network) I/F (i.e., interface) 118 that is used to connect with an external apparatus such as a PC (Personal Computer) (not shown) through the ASIC (2) 112 via a LAN.

The engine 130 includes an image reading part 131, an image outputting part 135, an image processing part 133 and a CPU 137. The image reading part 131 reads (or scans) an original and obtains image data. The image outputting part 135 prints image data onto paper or such. The image processing part 133 carries out various types of image processing such as modifying, correcting, editing, detecting characteristics, transforming and so forth of image data. The CPU 137 controls operations of these parts.

The FCU 125 has, as a part that achieves the facsimile function, a data processing part (not shown) that transmits and receives facsimile signals, and a communication interface (not shown). The FCU 125 acts as the above-mentioned facsimile reception part.

The operation part 127 functions as the user interface, and has an operation and display screen page 127A (see FIGS. 5A and 5B) from which the user's input operation for giving an instruction concerning a process is received, and from which an operating condition of the MFP which is set according to the user's instruction, a status of the MFP that changes according to an operation of the MFP and so forth, are displayed to the user. According to the first embodiment, the operation part 127 is always in an operating state.

The power supply part 150 has power supplied from a commercial AC (Alternating Current) power source through a connection part 170 such as a plug, and supplies the power, supplied through the power measurement part 160 (described later), to respective action parts of the MFP 100, as AC power as it is or, as DC (Direct Current) power converted from the AC power. The power supply part 150 is controlled by the controller 110 and supplies power to the action parts in forms that are required for the action parts as mentioned above. The power supply part 150 carries out operation of causing the MFP 100 to enter an energy saving operation mode in which the MFP 100 carries out energy saving operations. That is, in the normal operation state (i.e., a normal operation mode) in which power is supplied to all the action parts so that the action parts can operate, power supply to a predetermined action part (i.e., the engine 130) is stopped in a case where a predetermined energy saving entering condition is met, and the MFP 100 enters the energy saving operation mode. After that, in a case where a returning condition is met, the power supply having been stopped is restarted so that the MFP 100 returns to the normal operation mode from the energy saving operation mode. Thus, control of turning on and off the power supply is carried out. It is noted that such an operation flow of entering the energy saving operation mode and returning to the normal operation mode will be described later in detail with reference to FIG. 13. According to the first embodiment, the action part concerning the energy saving operation is the engine 130, control of turning on and off of power supply to the engine 130 is carried out, while the controller 110 is made to be always in an operating state and control of turning on and off of power supply to the controller 110 is not carried out with regard to energy saving operation. However, depending on a circuit configuration of the controller 110, not the entirety of the controller 110 may be made to be always in the operating state, and only part of the controller 110 may be made to be always in an operating state so that only the operation part 127 and the FCU 125 may be made to be always in their operating states.

The power measurement part 160 measures power supplied from the power source immediately after the connection part 170, and thus, all the power consumed by the MFP 100 is measured there, and the measured power consumption is output to the controller 110.

According to the first embodiment, the power measurement part 160 itself consumes power when carrying out power measurement operations, and it is possible to supply power to the engine 130 and the controller 110 without supplying power to the power measurement part 160 so that the power measurement part 160 does not operate. That is, the controller 110 can carry out control such that power supply to the power measurement part 160 is stopped, and thus, in a condition in which power measurement is not necessary, the control is carried out such that no power is supplied to the power measurement part 160. Thus, useless power consumption can be avoided, and power supply is adapted to the particular condition.

The MFP 100 configured as described above carries out, under the control of the controller 110, the scanner function, the copy function, the printer function, the facsimile reception function and the facsimile transmission function.

In the scanner function, the image reading part 131 reads (scans) an original and thus, image data is obtained. The obtained image data is then stored in the HDD 123 through the image processing part 133 and the ASIC (1) 113.

In the copy function, the image reading part 131 reads an original and image data is obtained. The obtained image data is then stored in the HDD 123 through the image processing part 133 and the ASIC (1) 113. Then, the image data stored in the HDD 123 is output (printed) by the image outputting part 135 through the ASIC (1) 113 and the image processing part 133.

In the printer function, image data stored in the HDD 123 or image data obtained from an external apparatus through the LAN I/F 118 is output (printed) by the image outputting part 135 through the ASIC (1) 113 or the ASIC (2) 112, the CPU 111 and the ASIC (1) 113, and the image processing part 133.

In the facsimile reception function, image data received by the FCU 125 from the outside of the MFP 100 is output (printed) by the image outputting part 135 through the ASIC (2) 112, the CPU 111, the ASIC (1) 113 and the image processing part 133.

In the facsimile transmission function, image data of an original obtained by the image reading part 131 is transmitted to the outside of the MFP 100 by the FCU 125 through the image processing part 133, the ASIC (1) 133, the CPU 111 and the ASIC (2) 112.

[Process of Controller when Power is Turned on]

In the configuration of the MFP 100 described above with reference to FIG. 1, the power supply part 150 is controlled by the ASIC (2) 112 of the controller 110. As mentioned above, turning on and off of the power supply to the engine 130 is controlled, and thus, the engine 130 is a target of the energy saving operation.

When power is turned on in the MFP 100, the MFP 100 is to receive a process request such as a job (i.e., a printing job or such), and is to start up to be able to carry out the requested process. A process carried out by the controller 110 when the power is turned on in the MFP 100 will be described first.

Figure 2:
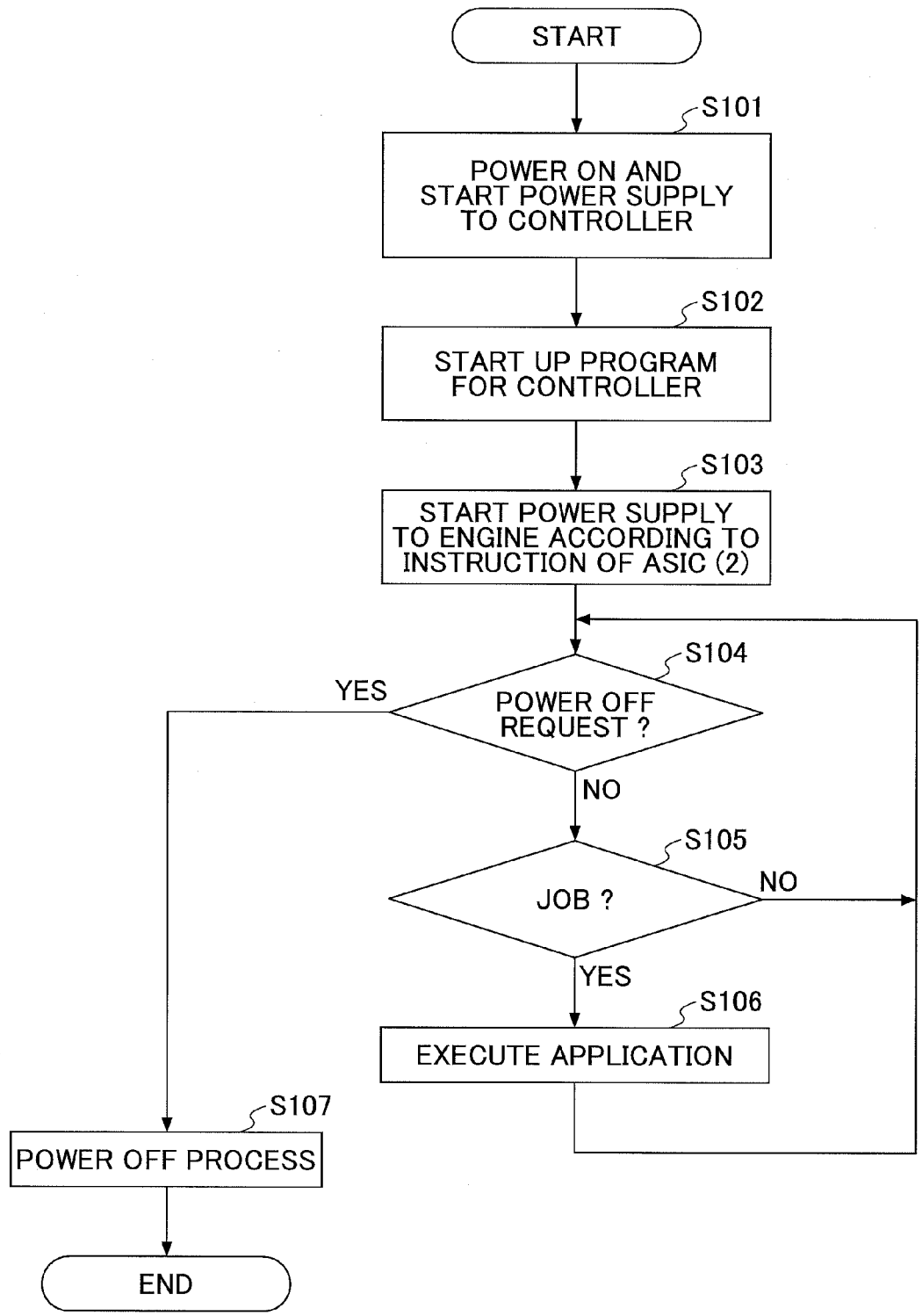
FIG. 2 is a flowchart showing one example of an operation flow of a process carried out by a controller of the MFP according to the first embodiment of the image processing apparatus when power is turned on in the MFP.

FIG. 2 shows an operation flow carried out by the controller 110 when the power is turned on in the MFP 100.

According to the operation flow of FIG. 2, first, the connection part 170 is connected to the power source such as the commercial power supply (for example, a wall outlet) and, for example, a manual switch (i.e., a power supply key 129, see FIGS. 5A and 5B) is pressed by the user. In response thereto, the power supply part 150 starts power supply to the controller 110 (step S101). It is noted that, to start power supply may be simply referred to as "power on".

Next, by an operation of the ASIC (2) 112 of the controller 110, the program stored in the NOR type flash memory 117 is started up, and a process is started according to an operation flow that is carried out according to the program (step S102).

When the process is started by the ASIC (2) 112, the power supply part 150 starts power supply to the engine 130 (step S103) in response to an instruction of the ASIC (2) 112 to turn on power supply to the engine 130. At this time, the MFP 100 enters the normal operation state (i.e., the normal operation mode) in which a process request such as a job can be received and the received process can be carried out ordinarily.

After that, the ASIC (2) 112 determines whether a power turning off request is generated (step S104). The power turning off request is generated when, for example, the power supply key 129 on the operation and display screen page 127A of the operation part 127 is pressed by the user. When the power turning off request is generated (step S104—YES), the ASIC (2) 112 carries out a power off process (step S107). After the power off process is carried out, the process of FIG. 2 is finished. It is noted that the power off process is a process of turning off the power supply to the controller 110 and the engine 130 from the power supply part 150.

On the other hand, when the power off request is not generated (step S104—NO), the ASIC (2) 112 determines whether a process request such as a job is generated (step S105). For example, a printing job (or a copying job), as an example of a process request, is generated when the user presses a start key (i.e., a start key 128, see FIGS. 5A and 5B) on the operation and display screen page 127A of the operation part 127.

When no process request is generated (step S105—NO), the process is returned to step S104 in which it is determined whether the power turning off request is generated, and then, the state of waiting for a process request is continued. On the other hand, when a process request is generated (step S105—YES), the generated process is carried out by using an application that is necessary to carry out the generated process according to the process request (step S106).

After the generated process is carried out, the process is returned to step S104 in which it is determined whether the power turning off request is generated, and then, a state of waiting for a process request is proceeded to.

[Flow of Power Consumption Calculation and Displaying (1)]

In the MFP 100 according to the first embodiment, power consumption measured by the power measurement part 160 is displayed on the operation part 127 that functions as the user interface, and also, turning on and off of the power supply to the power measurement part 160 is controlled and thus, selection is carried out as to whether the power measurement by the power measurement part 160 is carried out.

According to the first embodiment, in the normal operation state (i.e., the normal operation mode), the power measurement part 160 is made to operate, and the measured power consumption is displayed on the operation part 127. On the other hand, in the energy saving operation state (i.e., in the energy saving operation mode), the power measurement part 160 is not made to operate. At this time, since power consumption cannot be actually measured, power consumption is calculated by estimation. It is noted that such operations according to the first embodiment may be referred to as "power consumption calculation and displaying (1)", hereinafter.

Figure 3:
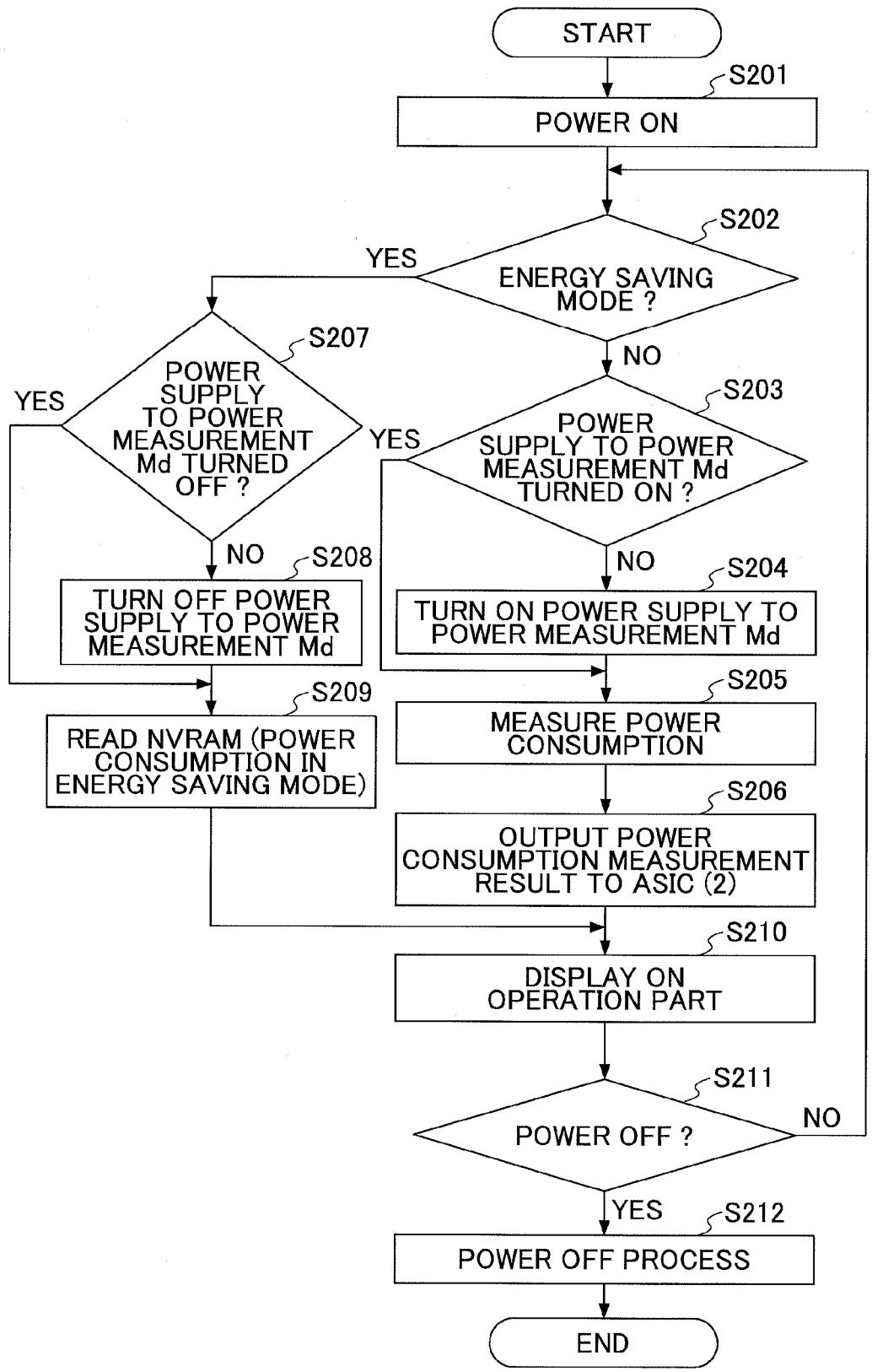
FIG. 3 is a flowchart showing one example of an operation flow of a power consumption calculation and displaying sequence in each of an energy saving operation and a normal operation carried out according to a given instruction, according to the first embodiment of the image processing apparatus.

FIG. 3 shows a flowchart concerning the power consumption calculation and displaying sequence in the respective ones of the normal and energy saving operations modes according to the first embodiment.

It is noted that a relationship between the operation flow of FIG. 3 and the operation flow of FIG. 2 is as follows. Since the operation flow of FIG. 3 is carried out as an operation of the controller 110, the operation flow starting after the power is turned on in the MFP 100 and before the power is turned off in the MFP 100 (step S202 through S211) is repeated after the power supply to the controller 110 is started until the power is turned off in the MFP 100 in the flow of FIG. 2. The power being turned off in the MFP 100 means that the power supply to the controller 110 and the power supply to the engine 130 (when power has been supplied to the engine 130) from the power supply part 150 are turned off. The power being turned on in the MFP 100 means that the power supply at least to the controller 110 is turned on.

According to the operation flow of FIG. 3, when the controller 110 starts operation as a result of the power being turned on in the MFP 100 in step S201, the controller 110 starts control according to the operation flow. First, the controller 110 determines whether the MFP 100 is in the energy saving operation mode (step S202). It is noted that the controller 110 monitors the energy saving entering condition and the returning condition, and sets the operation mode based on the monitoring result. Therefore, the controller 160 can determine whether the MFP 100 is in the energy saving operation mode by determining the operation mode that has been set as mentioned above.

When the MFP 100 is not in the energy saving operation mode, i.e., the MFP 100 is in the normal operation mode (step S202—NO), the ASIC (2) 112 of the controller 110 determines whether power supply to the power measurement part 160 (hereinafter, referred to as "power measurement Md") has been turned on (step S203). More specifically, the power measurement Md 160 sends an ON/OFF notification signal that indicates whether the power supply to the power measurement Md 160 has been turned on (see FIG. 14) to the ASIC (2) 112. The ASIC (2) 112 determines from the ON/OFF notification signal whether the power supply to the power measurement Md 160 has been turned on. The meaning of "power supply to the power measurement Md 160 is turned on" will be described later with reference to FIG. 14.

As mentioned above, the power measurement Md 160 is made to operate in the normal operation mode. Therefore, when the power supply to the power measurement Md 160 has been turned on (step S203—YES), nothing is carried out since the power measurement Md 160 is already in the operating state. However, when the power supply to the power measurement Md 160 has not been turned on yet (step S203—NO), the power supply to the power measurement Md 160 is turned on (step S204) so that the power measurement Md 160 is made to operate.

After that, the power measurement Md 160 that has the power supplied and thus operates carries out power measurement operations, and thus, measures power consumption of the MFP 100 that is in the normal operation mode in a real-time manner (step S205).

Further, the power measurement Md 160 outputs the power consumption obtained as the measurement result to the ASIC (2) 112 in a real-time manner (step S206).

On the other hand, when the MFP 100 is in the energy saving operation mode (step S202—YES), the ASIC (2) 112 determines whether the power supply to the power measurement Md 160 has been turned on (step S207) in the same method as that in the case of the normal operation mode (step S203).

In the case of the energy saving operation mode, no power is supplied to the engine 130 that consumes high power in its operating state, and an action part to which power is supplied is the controller 110. Then, it is possible to estimate power consumption in the MFP 100 close to power consumption that would be actually measured, by using previously experimentally obtained power consumption, for example. Therefore, the power measurement Md 160 is not made to operate in the energy saving operation mode, according to the first embodiment.

Thus, the ASIC (2) 112 does nothing since the power measurement Md 160 is already in the not operating state, when the power supply to the power measurement Md 160 has been turned off (step S207—YES). On the other hand, the ASIC (2) 112 turns off the power supply to the power measurement Md 160 so that the power measurement Md 160 is made to be the not operating state, when the power supply to the power measurement Md 160 has been turned on (step S207—NO).

After that, since the power measurement Md 160 is in the not operating state and does not carry out power measurement, the ASIC (2) 112 reads power consumption of the MFP 100 of a time when the MFP 100 is in the energy saving operation mode from the NVRAM 115 as an estimated value (step S209). The power consumption of the MFP 100 of the time when the MFP 100 is in the energy saving operation mode has been previously written in the NVRAM 115. That is, previously the power consumption of the MFP 100 of the time when the MFP 100 is in the energy saving operation mode has been previously experimentally obtained, and is thus used as the estimated value.

It is noted that in the case where the power consumption of the MFP 100 previously written in the NVRAM 115 is thus used as the estimated value, an error may be included there when a current condition of the MFP 100 differs from a condition of the MFP 100 in which the power consumption to be used as the estimated value has been previously obtained experimentally. Therefore, for the purpose of obtaining the estimated value that is closer to the actually measured value, it is preferable to obtain power consumption values of the MFP 100 in various conditions when previously obtaining power consumption experimentally, and write the thus-obtained power consumption values in the NVRAM 115. Then, it is preferable that in step S209, when the power consumption is read from the NVRAM 115 as the estimated value, the power consumption value that has been experimentally obtained in the condition of the MFP 100 the same as or closest to the current condition is read. Alternatively or further, the power consumption value having been experimentally obtained and written in the NVRAM 115 previously may be appropriately corrected according to the current condition of the MFP 100, when the power consumption is read from the NVRAM 115 as the estimated value in step S209.

Next, the ASIC (2) 112 displays the power consumption obtained from step S206 or S209 on the operation part 127 as the user interface (for example, a display field 126 shown in FIGS. 5A, 5B, described later) (step S210).

After displaying the power consumption on the operation part 127, the ASIC (2) 112 determines whether the power turning off request is generated (step S211). When the power tuning off is generated (step S211—YES), the power off process is carried out (step S212). After the power off process is carried out, the process of FIG. 3 is finished.

On the other hand, when the power turning off request is not generated (step S211—NO), the ASIC (2) 112 returns to step S202 of determining whether the MFP 100 is in the energy saving operation mode, and repeats the control operation according to the operation flow starting from step S202.

Thus, as a result of the control being carried out according to the operation flow of FIG. 3 of the power consumption calculation and displaying (1), an increase in power consumption in the energy saving operation state (i.e., the energy saving operation mode) can be minimized, and thus, it is possible to increase the power saving effect. Further, the user can know the estimated power consumption of the MFP 100 in the power saving operation. Further, also, the user can know the accurate power consumption of the MFP 100 in the normal operation mode. Thus, the user can understand the power consumption values of the MFP 100 in both operation modes, and thus, the user's awareness of power saving can be boosted.

[Flow of Power Consumption Calculation and Displaying (2)]

Below, a second embodiment of the present invention will be described. The second embodiment is the same as the above-described first embodiment except for the configuration described below. Therefore, duplicate description will be omitted, as is appropriate, for the same parts/components as those of the first embodiment.

According to the first embodiment of the power consumption calculation and displaying (1) described above, the power measurement Md 160 is not used in the energy saving operation mode.

According to the second embodiment, regardless of whether the MFP 100 is in the energy saving operation mode or the normal operation mode, the user can set from the user interface (i.e., the operation part 127) as to whether the power measurement Md 160 is made to operate, i.e., whether the measurement result of the power measurement Md 160 is used as the power consumption value to be displayed on the operation part 127. Thus, regardless of the MFP 100 being in the energy saving operation mode or the normal operation mode, the power consumption, obtained from either of the respective methods, i.e., the method of obtaining the power consumption through the actual measurement by using the power measurement Md 160 and the method of obtaining the estimated value of the power consumption by using the power consumption experimentally obtained and written in the NVRAM 115 previously, is displayed on the operation part 127. It is noted that the operation according to the second embodiment may be referred to as "power consumption calculation and displaying (2)", hereinafter).

According to the second embodiment, the operation is carried out according to the user's setting to select whether the power measurement Md 160 is made to operate and the thus-measured power consumption is displayed on the operation part 127 (hereinafter, referred to as "power consumption measurement mode ON" or simply "measurement mode ON") or the power measurement Md 160 is not made to operate (hereinafter, referred to as "power consummation measurement mode OFF" or simply "measurement mode OFF"). Therefore, in the case of the power consumption measurement mode ON, it is possible to obtain the accurate power consumption by using the measurement result of the power measurement Md 160 even at a time of the energy saving operation mode. It is noted that at a time of the power consumption measurement mode OFF, the power consumption is not actually measured, and thus, as in the case of the energy saving operation mode of the first embodiment (see FIG. 3), the estimated value is used.

Figure 4:
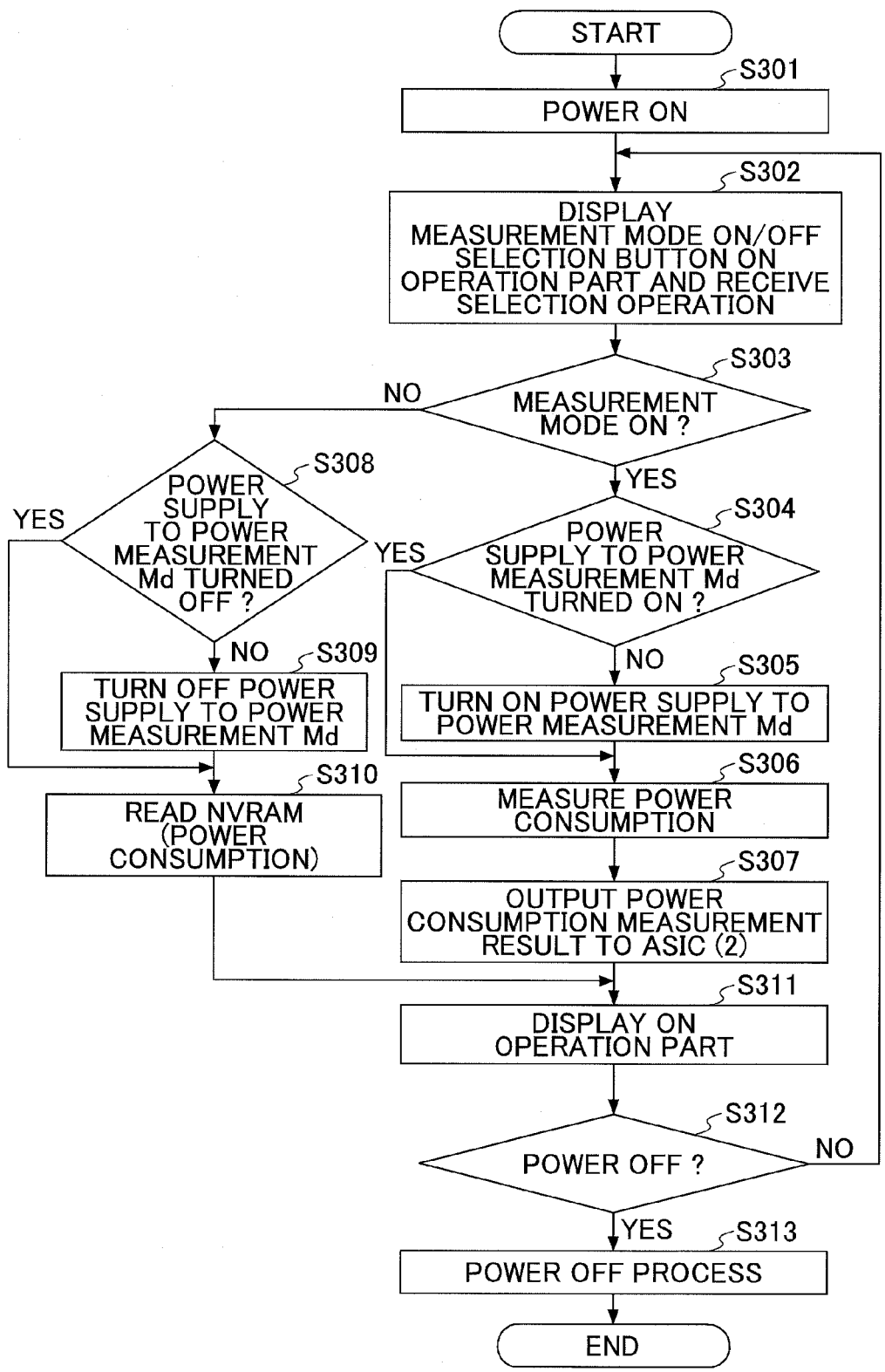
FIG. 4 is a flowchart showing one example of an operation flow of a power consumption calculation and displaying sequence carried out in response to a user's selection for a power consumption measurement mode ON or a power consumption measurement mode OFF according to a given instruction, according to a second embodiment of the image processing apparatus.

FIG. 4 shows an operation flow concerning a power consumption calculation and displaying sequence according to the second embodiment in which the selection is carried out from the measurement mode ON and the measurement mode OFF.

It is noted that in the operation flow of FIG. 4, the operation flow after the power supply is turned on in the MFP 100 and before the power supply is turned off in the MFP 100 (steps S302 through S312) is repeated, from the power supply to the controller 110 being started to the power supply being turned off in the MFP 100 in the operation flow of FIG. 2.

According to the flow of FIG. 4, when the power is supplied in the MFP 100 and the controller 110 starts operation, the controller 110 starts the control according to the flow of FIG. 4 (step S301). First, the controller 110 displays on the operation part 127 an input screen page for the user to select the measurement mode ON or the measurement mode OFF, and receives the user's selection operation (step S302).

Figure 5A:
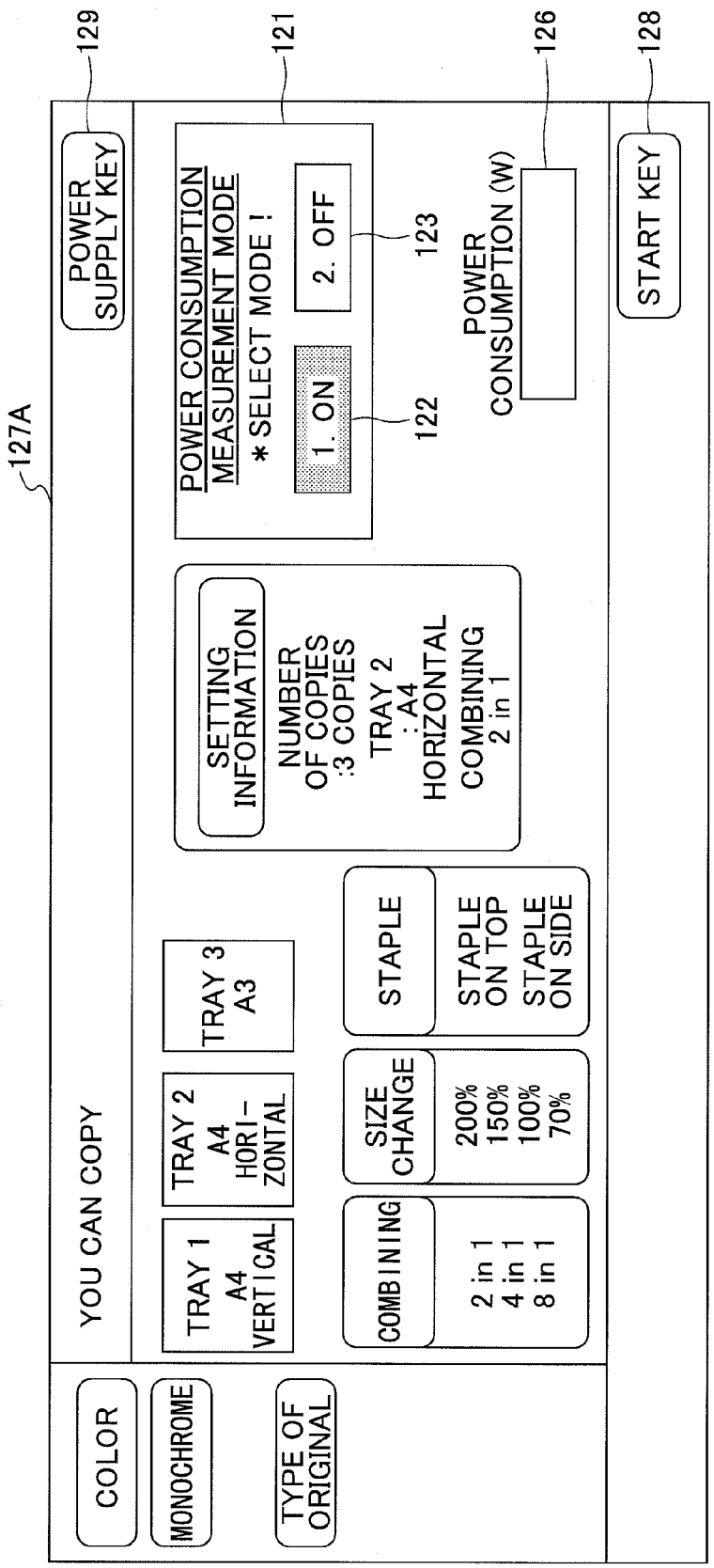
FIGS. 5A and 5B show one example of an input screen page (i.e., an operation and display screen page) of a user interface concerning the operation flow shown in FIG. 4.
Figure 5B:
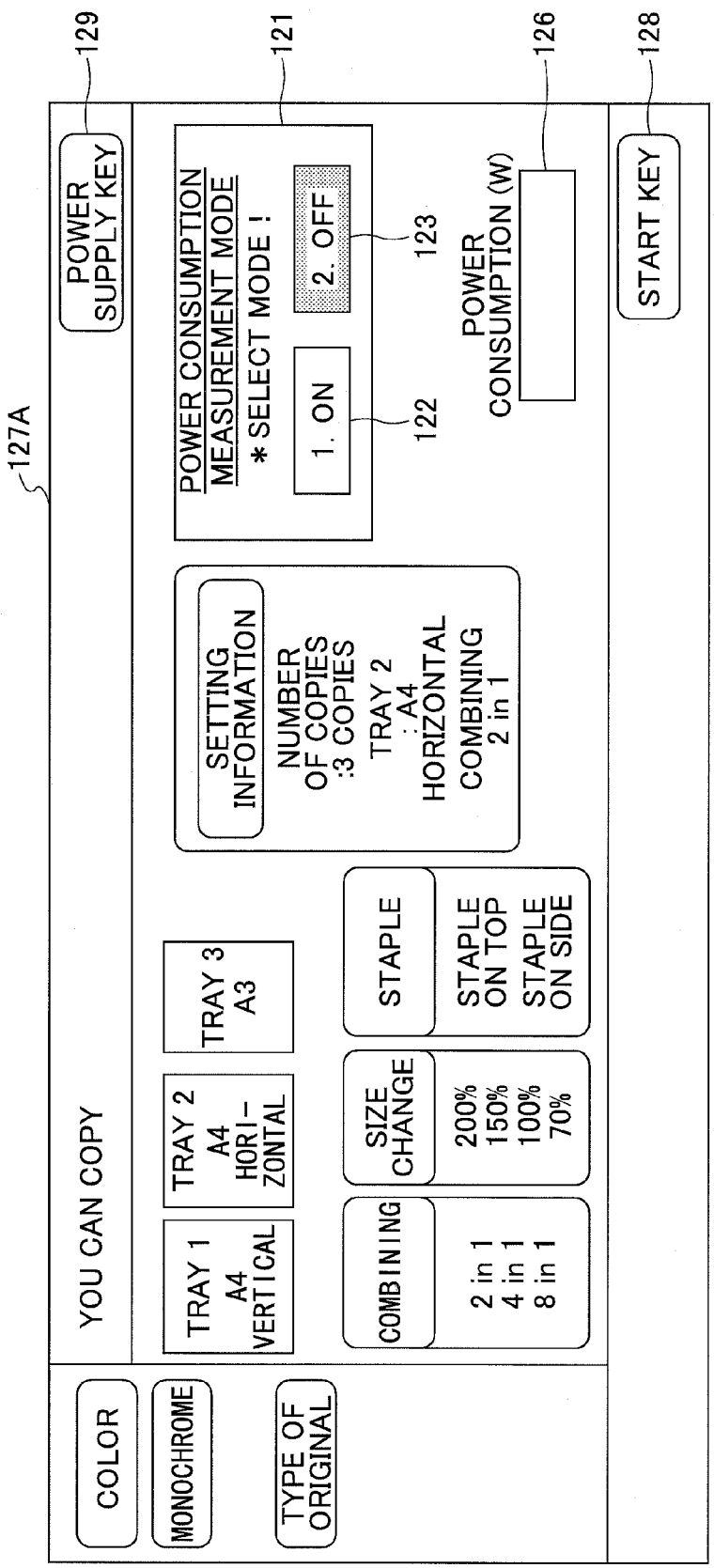

FIGS. 5A and 5B show one example of the input screen page, i.e., the operation and display screen page 127A. As shown in FIGS. 5A and 5B, a display window 121 for the user to select the power consumption measurement mode (i.e., the measurement mode ON or the measurement mode OFF) is provided in the operation and display screen page 127A that the operation part 127 has, and there, input buttons 122 and 123 for the measurement mode ON ("1. ON") and the measurement mode OFF ("2. OFF"), respectively, from which the user is to select, are displayed. When a touch panel type LCD (Liquid Crystal Display), for example, is used to display the operation and display screen page 127A, the user can select either of the measurement mode ON and the measurement mode OFF by touching the corresponding one of the input buttons 122 and 123. FIG. 5A shows a state in which the user has pressed the "ON" input button 122 and FIG. 5A shows a state in which the user has pressed the "OFF" input button 123. As shown in FIGS. 5A and 5B, the user can recognize that his or her input operation has been received, as a result of the display state of the selected button having been changed.

It is noted that as shown in FIGS. 5A and 5B, the operation and display screen page 127A includes, for example, as hardware keys, the power supply key 129 and the start key 128. The power supply key 129 is a key for the user to turn on and off the power supply in the MFP 100. The start key 128 is a key for the user to start, for example, printing or copying an original in the copy function. All of the contents displayed on the operation and display screen page 127A (including the display window 121 for the user to select the power consumption measurement mode to the measurement mode ON or the measurement mode OFF) other than these operation keys 129 and 128 are displayed by software. For example, the contents displayed on the operation and display screen page 127A include, from the left end, buttons for selecting color printing or monochrome printing ("COLOR" and "MONOCHROME" in FIGS. 5A and 5B); a button for selecting a type of an original ("TYPE OF ORIGINAL"); buttons for selecting printing paper ("TRAY A4 VERTICAL", "TRAY A4 HORIZONTAL", "TRAY A3"); a button for selecting combining printing ("COMBINING"); a button for selecting size change printing ("SIZE CHANGE"); a button for selecting a bookbinding process by using staples ("STAPLE"); and a display window showing the contents that are set by the user ("SETTING INFORMATION").

Further, on the operation and display screen page 127A, the above-mentioned display window 126 for displaying the power consumption is provided.

Further, the operation and display screen page 127A shown in FIGS. 5A, 5B is a screen page for the copy function. By operating a changeover switch (not shown) that the operating part 127 has, the user can cause the operation part 127 to display other operation and display screen pages for the other functions, i.e., the scanner function, the facsimile transmission function and so forth.

Next, the ASIC (2) 112 determines whether the user has selected the measurement mode ON or the measurement mode OFF as a result of the user operating the input button 122 or 123 (step S303).

When the user has selected the measurement mode ON, i.e., the mode of using the power measurement Md 160 (step S303—YES), the ASIC (2) 112 determines whether the power supply to the power measurement Md 160 has been turned on (step S304).

When the power supply to the power measurement Md 160 has been turned on (step S304—YES), nothing is carried out since the power measurement Md 160 is thus already in the operating state. However, when the power supply to the power measurement Md 160 has not been turned on (step S304—NO), the ASIC (2) 122 turns on the power supply to the power measurement Md 160 to cause the power measurement Md 160 to operate (step S305).

Then, since the power measurement Md 160 has the power supply turned on, the power measurement Md 160 carries out power measurement operations and measures the power consumption of the MFP 100 (step S306). It is noted that, at this time, the power measurement Md 160 measures the power consumption, regardless of whether the MFP 100 is in the normal operation mode or the energy saving operation mode, according to the second embodiment.

Further, the power measurement Md 160 outputs the power consumption obtained as the measurement result to the ASIC (2) 112 (step S307).

On the other hand, when the measurement mode OFF, i.e., the mode of not using the power measurement Md 160, is selected (step S303—NO), the ASIC (2) 112 determines whether the power supply to the power measurement Md 160 has been turned on (step S308), the same as in the case of the measurement mode ON.

When the power supply to the power measurement Md 160 has not been turned on (step S308—NO), nothing is carried out since the power measurement Md 160 is already in the not operating state. However, when the power supply to the power measurement Md 160 has been turned on (step S308—YES), the ASIC (2) 112 turns off the power supply to the power measurement Md 160 (step S309) so that the power measurement Md 160 is made to be in the not operating state.

After that, since the power measurement Md 160 does not operate and does not carry out the power measurement operation, the power consumption, previously written in the NVRAM 115, of a time of the MFP 100 being in the normal operation mode or a time of the MFP 100 being in the energy saving operation mode, is read as the estimated value (step S310). That is, the power consumption of the MFP 100 at the time of the normal operation mode and the power consumption of the MFP 100 at the time of the energy saving operation mode has been previously obtained experimentally, the obtained values have been written in the NVRAM 115, and are after that used as the estimated values. In this case, when the current operation mode of the MFP 100 is the normal operation mode, the ASIC (2) 112 reads the power consumption of the MFP 100 that has been experimentally obtained previously at a time of the normal operation mode from the NVRAM 115 and used as the estimated value. When the current operation mode of the MFP 100 is the energy saving operation mode, the ASIC (2) 112 reads the power consumption of the MFP 100 that has been experimentally obtained previously at a time of the energy saving operation mode from the NVRAM 115 and used as the estimated value.

It is noted that in the case where the power consumption previously written in the NVRAM 115 is used as the estimated value, an error may be included in the estimated value when a current condition of the MFP 100 differs from a condition of the MFP 100 in which previously the power consumption has been obtained experimentally. Therefore, for the purpose of obtaining the estimated value that is closer to the actually measured value, it is preferable to previously obtain power consumption values in various conditions experimentally, and write the thus-obtained power consumption values in the NVRAM 115. Then, it is preferable that when power consumption is read from the NVRAM 115 as the estimated value in step S310, the power consumption value that has been experimentally obtained in a condition of the MFP 100 the same as or closest to the current condition of the MFP 100 is selectively read. Especially, in the normal operation mode, the error may be likely to be increased, and thus, it is preferable that power consumption is experimentally obtained in various conditions of the MFP 100 based on analysis of actual operating conditions of the MFP 100 and so forth, and the thus-obtained power consumption values are written in the NVRAM 115. Alternatively or further, the power consumption value having been experimentally obtained and written in the NVRAM 115 may be appropriately corrected according to the current condition of the MFP 100 when power consumption is read from the NVRAM 115 as the estimated value in step S310. In this case, since the error is likely to be increased especially in the normal operation mode, it is preferable that the above-mentioned correction is carried out based on the analysis of actual operating conditions of the MFP 100.

Next, the ASIC (2) 112 displays the power consumption obtained in step S307 or S310 on the operation part 127 (for example, the display window 126 shown in FIGS. 5A and 5B) (step S311). It is noted that when the displaying is carried out, such a method may be used that an annotation is added to indicate that the power consumption obtained in step S310 is the "estimated value".

After displaying the power consumption on the operation part 127, the ASIC (2) 112 determines whether the power turning off request is generated (step S312). In a case where the power turning off request is generated (step S312—YES), the ASIC (2) 112 carries out the power off process (step S313). The process of FIG. 4 is finished when the power off process is thus carried out.

On the other hand, in a case where the power turning off request is not generated (step S312—NO), the ASIC (2) 112 returns to step S302 of displaying the input screen page for the user to select the measurement mode ON or the measurement mode OFF, and repeats the control operation starting from step S302.

Thus, through the control according to the flow of FIG. 4 for the power consumption calculation and displaying (2), the user can know the power consumption in a state where, regardless of whether the MFP 100 is in the normal operation mode or the energy saving operation mode, the user has selected the mode of the user being able to know the accurate power consumption (i.e., the measurement mode ON) or the mode of the user being able to know the power consumption in the state where an increase in the power consumption is minimized and thus the power saving effect is high (i.e., the measurement mode OFF). Thus, it is possible to boost the user's awareness of power saving.

[Calculation of Average Power Consumption]

Below, a third embodiment of the present invention will be described. The third embodiment is the same as the above-described first embodiment except for the configuration described below. Therefore, duplicate description will be omitted as is appropriate for the parts/components the same as those of the first embodiment.

According to the first embodiment of the power consumption calculation and displaying (2) described above, the value of power consumption displayed to the user is, in a case where the measurement result of the power measurement Md 160 is used, the power consumption obtained in a real-time manner at a time of the measurement or sampling. Therefore, when the measurement result is displayed as it is, the measured value may vary depending on the actual operating condition of the MFP 100. Further, when an abnormal value of the power consumption may be obtained and displayed because of an accidental factor, the measurement result may not be a suitable one for the user to know the power consumption of the MFP 100 operating without trouble.

According to the third embodiment, in the case where the measured value of the power measurement Md 160 is used, an averaging process is additionally carried out, thus average power consumption is obtained, and the average power consumption is used as a value of the power consumption displayed on the operation part 127.

FIG. 6 shows an operation flow of a power consumption calculation and displaying sequence in which a process of calculating the average power consumption is additionally carried out according to the third embodiment.

It is noted that in the operation flow of FIG. 6, the operation flow after the power supply is turned on in the MFP 100 and before the power supply is turned off in the MFP 100 (steps S402 through S411) is repeated, from the power supply to the controller 110 being started to the power supply being turned off in the MFP 100 in the operation flow of FIG. 2.

In the flow of FIG. 6, steps S401, S402, S403 and S404 correspond to steps S201, S202, S203 and S204 in the flow of FIG. 3, respectively. In the flow of FIG. 6, steps S407, S408 and S409 correspond to steps S207, S208 and S209 in the flow of FIG. 3, respectively. In the flow of FIG. 6, steps S410, S411 and S412 correspond to steps S210, S211 and S212 in the flow of FIG. 3, respectively. In the steps in the flow of FIG. 6 corresponding to those in the flow of FIG. 3, the identical processes are carried out as those of the corresponding steps of the flow of FIG. 3, and duplicate description will be omitted as is appropriate.

In this case, the power measurement Md 160 has a function of an energy meter (or watt-hour meter) to measure integral power consumption. Further, the ASIC (2) 112 stores in the NVRAM 115, in an overwriting manner, the integral power (energy) consumption of the MFP 100 which is periodically (for example, 8 o'clock morning every Monday) obtained and output by the power measurement Md 160 by using the function of the energy meter. Further, the ASIC (2) 112 stores in the NVRAM 115, in an overwriting manner, the cumulative operation time period of the MFP 100 in the normal operation mode from the time at which the integral power consumption has been stored in the NVRAM 115 in the overwriting manner periodically as mentioned above to the present time.

In this case, the power measurement Md 160 obtains the integral power consumption of the MFP 100 at the present time in step S405, and outputs the obtained integral power consumption to the ASIC (2) 112 in step S406. Then, in step S406A, the ASIC (2) 112 reads the integral power consumption of the MFP 100 having been stored in the overwriting manner in the NVRAM 115 periodically as mentioned above. Next, in step S406B, the ASIC (2) 112 subtracts the integral power consumption periodically stored in the overwriting manner in the NVRAM 115 and read therefrom in step S406A from the integral power consumption of the present time, and thus obtains the difference value of the integral power consumption. Then, the ASIC (2) 112 reads the cumulative operation time period having elapsed in the normal operation mode from the time of the integral power consumption having been stored in the overwriting manner to the present time. Then, the above-mentioned difference value of the integral power consumption is divided by the above-mentioned cumulative operation time period, and thus, the average power consumption in the normal operation mode from the time of the integral power consumption having been periodically stored in the overwriting manner to the present time is obtained. Thus, the ASIC (2) 112 is one example of an average power consumption calculation part.

Next, in step S410, the ASIC (2) 112 displays the thus-obtained average power consumption on the operation part 127 (for example, the display field 126 shown in FIGS. 5A and 5B).

It is noted that the process of calculating the average power consumption being carried out additionally may be applied also in the above-mentioned second embodiment of the power consumption calculation and displaying (2) (see FIG. 4). In this case, for example, steps S306 and S307 of FIG. 4 may be replaced by steps S405, S406, S406A and S406B of FIG. 6. However, in this case, instead of the above-mentioned cumulative operation time period of the MFP 100 having elapsed in the normal operation mode, a cumulative operation time period of the MFP 100 having elapsed in the measurement mode ON is used, and thus, the average power consumption in the measurement mode ON is obtained, instead of the average power consumption in the normal operation mode, since the power measurement Md 160 operates in the measurement mode ON in the flow of FIG. 4.

[Automatic Setting of Power Consumption Measurement Mode ON/OFF]

Below, a fourth embodiment of the present invention will be described. The fourth embodiment is the same as the above-described second embodiment. Therefore, duplicate description will be omitted as is appropriate for the same parts/components as those of the second embodiment.

According to the second embodiment of the power consumption calculation and displaying (2), the power consumption calculation and displaying sequence is carried out according to the flow of FIG. 4 in which the user selects the measurement mode ON or the measurement mode OFF through the user's setting operation. In contrast thereto, according to the fourth embodiment, selection of the measurement mode ON or the measurement mode OFF is carried out automatically.

A specific method of automatically selecting the measurement mode ON or the measurement mode OFF will now be described. That is, it is determined whether to use the power measurement Md 160, i.e., whether to select the measurement mode ON or the measurement mode OFF, from a determination result as to whether the average power consumption is a value within a predetermined range. More specifically, according to the fourth embodiment, the measurement mode ON is selected when the average power consumption does not exceed a predetermined value, and the measurement mode OFF is selected when the average power consumption exceeds the predetermined value.

Figure 7:
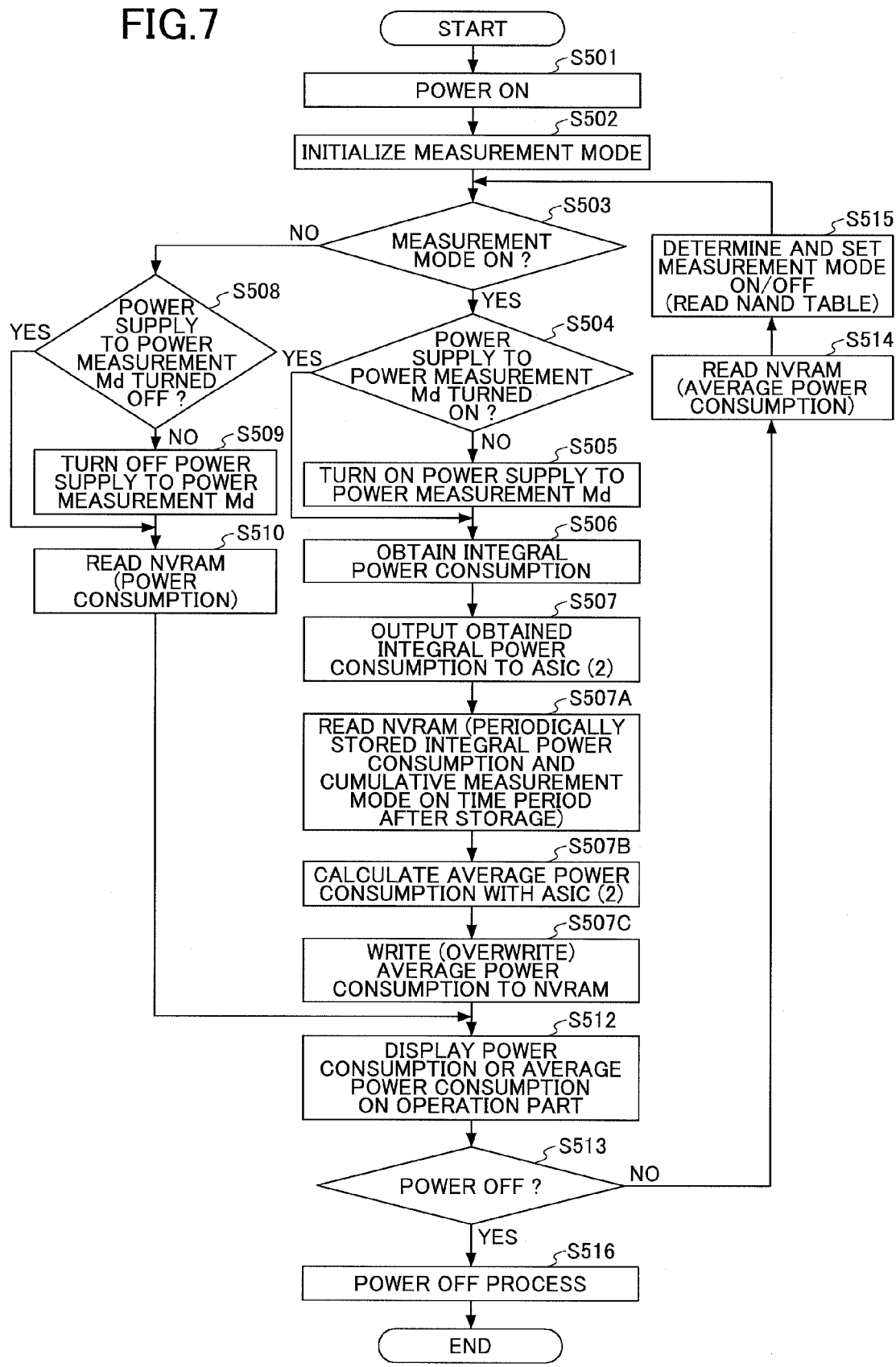
FIG. 7 is a flowchart showing one example of an operation flow in which a process of calculating an average power consumption is additionally carried out and a process of automatically setting the power consumption measurement mode ON or the power consumption measurement mode OFF is additionally carried out in the operation flow shown in FIG. 4, according to a fourth embodiment of the image processing apparatus.

FIG. 7 shows an operation flow of a power consumption calculation and displaying sequence in which the power consumption measurement mode ON or the power consumption measurement mode OFF is automatically set.

It is noted that in the operation flow of FIG. 7, the operation flow after the power supply is turned on in the MFP 100 and before the power supply is turned off in the MFP 100 (steps S503 through S513) is repeated, from the power supply to the controller 110 being started to the power supply being turned off in the MFP 100 in the operation flow of FIG. 2.

In the flow of FIG. 7, steps S501, S503, S504 and S505 correspond to steps S301, S303, S304 and S305 in the flow of FIG. 4, respectively. In the flow of FIG. 7, steps S508, S509 and S510 correspond to steps S308, S309 and S310 in the flow of FIG. 4, respectively. In the flow of FIG. 7, steps S513 and S516 correspond to steps S312 and S313 in the flow of FIG. 4, respectively. In the flow of FIG. 7, steps S506, S507, S507A and S507B correspond to steps S405, S406, S406A and S406B in the flow of FIG. 6, respectively. In the steps in the flow of FIG. 7 corresponding to those in the flow of FIG. 4, the identical processes are carried out as those of the corresponding steps of the flow of FIG. 4, and duplicate description will be omitted as is appropriate. In the steps in the flow of FIG. 7 corresponding to those in the flow of FIG. 6, the identical processes are carried out as those of the corresponding steps of the flow of FIG. 6 except that, instead of the above-mentioned cumulative operation time period of the MFP 100 having elapsed in the normal operation mode, the cumulative operation time period of the MFP 100 having elapsed in the measurement mode ON is used, and duplicate description will be omitted as is appropriate.

That is, in the flow of FIG. 7, instead of step S302 in the flow of FIG. 4 of "displaying the buttons to select the measurement mode ON or the measurement mode OFF and receiving a selection operation", steps S502, S514 and S515 (described later) are carried out for automatically setting the power consumption measurement mode ON or the power consumption measurement mode OFF. Further, instead of step S306 of measuring the power consumption and step S307 of outputting the power consumption measurement result to the ASIC (2) 112 in the flow of FIG. 4, steps S506, S507, S507A and S507B are provided to calculate the average power consumption in the measurement mode ON. As for steps S506, S507, S507A and S507B for calculating the average power consumption in the measurement mode ON, the description has been made above for the corresponding steps S405, S406, S406A and S406B in the flow of FIG. 6 except that, as mentioned above, instead of the above-mentioned cumulative operation time period of the MFP 100 having elapsed in the normal operation mode, the cumulative operation time period of the MFP 100 having elapsed in the measurement mode ON is used, and duplicate description will be omitted as is appropriate.

That is, instead of the cumulative operation time period of the MFP 100 having elapsed in the normal operation mode from the time at which the integral power consumption has been stored in the NVRAM 115 in the overwriting manner periodically as mentioned above to the present time, the ASIC (2) 112 stores in the NVRAM 115, in an overwriting manner, the cumulative operation time period of the MFP 100 in the measurement mode ON from the time at which the integral power consumption has been stored in the NVRAM 115 in the overwriting manner periodically as mentioned above to the present time.

In this case, the power measurement Md 160 obtains the integral power consumption of the MFP 100 at the present time in step S506, and outputs the obtained integral power consumption to the ASIC (2) 112 in step S507. Then, in step S507A, the ASIC (2) 112 reads the integral power consumption of the MFP 100 having been stored in the overwriting manner in the NVRAM 115 periodically. Next, in step S507B, the ASIC (2) 112 subtracts the integral power consumption periodically stored in the overwriting manner in the NVRAM 115 and read therefrom in step S507A from the integral power consumption of the present time, and thus obtains the difference value of the integral power consumption. Then, the ASIC (2) 112 reads the cumulative operation time period having elapsed in the measurement mode ON from the time of the integral power consumption having been stored in the overwriting manner to the present time. Then, the above-mentioned difference value of the integral power consumption is divided by the above-mentioned cumulative operation time period, and thus, the average power consumption in the measurement mode ON from the time of the integral power consumption having been periodically stored in the overwriting manner to the present time is obtained.

In the flow of FIG. 7, the ASIC (2) 112 starts the control according to the flow of FIG. 7 (step S501) when the ASIC (2) 112 operates as a result of the power being turned on in the MFP 100. First, the ASIC (2) 112 initializes the setting of the power consumption measurement mode, to be selected to the measurement mode ON or the measurement mode OFF (step S502). According to the fourth embodiment, the power consumption measurement mode is initialized to the measurement mode ON in step S502.

Next, the ASIC (2) 112 determines the setting of the power consumption measurement mode (step S503).

When the power consumption mode is the measurement mode ON, i.e., the mode of using the power measurement Md 160 (step S503—YES), the ASIC (2) 112 carries out the process according to the flow starting from step S504 of determining whether the power supply to the power measurement Md 160 has been turned on, up to step S512 of displaying the average power consumption of the MFP 100 on the operation part 127 (for example, the display field 126 of FIGS. 5A, 5B), through the calculation of the average power consumption of the MFP 100. It is noted that in step S507C, the ASIC (2) 112 stores the average power consumption obtained through steps S506, S507, S507A and S507B in the NVRAM 115 in a overwriting manner. Further, when the power consumption measurement mode is the measurement mode OFF in step S503 (step S503—NO), the ASIC (2) 112 carries out the process according to the flow starting from step S508 of determining whether the power supply to the power measurement Md 160 has been turned off, up to step S512 of displaying the estimated value of power consumption of the MFP 100 on the operation part 127, through obtaining the estimated value of power consumption of the MFP 100.

After displaying the average power consumption or the estimated value of power consumption on the operation part 127 in step S512, the ASIC (2) 112 determines whether the power turning off request is generated (step S513). When the power turning off request is generated (step S513—YES), the ASIC (2) 112 carries out the power off process (step S516). When the power off process is thus carried out, the flow is finished.

On the other hand, when the power turning off request is not generated (step S513—NO), the ASIC (2) 112 reads the average power consumption having been written in the NVRAM 115 in step S507C, and thus obtains the average power consumption at the present time (step S514).

Next, based on the obtained average power consumption, the ASIC (2) 112 determines whether to set the power consumption measurement mode ON or the power consumption measurement mode OFF, and sets the determined power consumption measurement mode (step S515). Thus, the ASIC (2) 122 acts as one example of a power measurement necessity determination part.

The determination as to whether to set the power consumption measurement mode ON or the power consumption measurement mode OFF in step S515 is carried out according to whether the average power consumption at the present time is a value within a predetermined range. FIG. 8 shows one example of a table to be used for the determination. The table of FIG. 8 prescribes that the measurement mode ON is set when the average power consumption does not exceed a predetermined value (XXW) and the measurement mode OFF is set when the average power consumption exceeds the predetermined value (XXW). Therefore, the ASIC (2) 112 compares the average power consumption obtained in step S514 with the predetermined value (XXW), determines whether to set the measurement mode ON or the measurement mode OFF according to the table of FIG. 8, and sets the power consumption measurement mode according to the determination result by replacing the previously set power consumption measurement mode.

Next, the ASIC (2) 112 returns to step S503 of determining whether the measurement mode ON or the measurement mode OFF has been set, and repeats the control operation according to the flow starting from step S503.

Thus, according to the fourth embodiment, the control is carried out according to the flow of FIG. 7 of the power consumption calculation and displaying, and the power consumption measurement mode is automatically set to the measurement mode ON or the measurement mode OFF while the power consumption calculation and displaying is carried out. Therefore, the operation suitable to the operating conditions can be carried out automatically without the need of the user's operation. Thus, it is possible to improve the performance of the MFP 100.

[Change of Setting of Energy Saving Entering Time Period]

Below, a fifth embodiment of the present invention will be described. The fifth embodiment is the same as the above-described first embodiment except for the configuration described below. Duplicate description will be omitted as is appropriate for the parts/components corresponding to those of the first embodiment.

According to the fifth embodiment, the energy saving operation mode is carried out while the power consumption calculation and displaying is carried out in each of the above-mentioned first through fourth embodiments. Entering the energy saving operation mode from the normal operation mode is carried out in a case where, as mentioned above, the predetermined entering condition (that may be referred to as "energy saving entering condition") is met in the normal operation mode in which ordinary operation can be carried out. Thus, the energy saving operation is carried out where power supply to the predetermined action part (i.e., the engine 130) is turned off. It is noted that entering the energy saving operation mode from the normal operation mode may be simply referred to as "energy saving entering".

The above-mentioned energy saving entering condition is that in a state of ordinary operation can be carried out, i.e., in the normal operating condition, a state where a change of a status of the MFP 100 does not occur continues more than a predetermined time period. Then, when the predetermined time period (referred to as an "energy saving entering time period", hereinafter) is exceeded in the state where a change of a status of the MFP 100 does not occur, the MFP 100 enters the energy saving operation mode. It is noted that the change of the status of the MFP 100 may be, for example, the user's input operation to the operation part 127, the user's setting an original to be read by the MFP 100, the user's coming to the MFP 100 or such. In a broad sense, the change of the status of the MFP 100 may be a change in a state which is as an opportunity to carry out a process of a job such as a copying job.

If the energy saving entering time period is fixed, energy saving entering occurs in the fixed time period that has been set, regardless of a particular operating condition. However, there may be a case where the energy saving effect may be increased when energy saving entering occurs earlier, or a case where the energy saving effect may be increased when energy saving entering occurs later. Therefore, it may be possible to increase the energy saving effect by appropriately changing the energy saving entering time period.

It may be possible to increase the energy saving effect by achieving such a relationship between the average power consumption and the energy saving entering time that the energy saving entering time period is shortened as the average power consumption becomes higher.

Therefore, according to the fifth embodiment, in order to achieve the above-mentioned relationship between the average power consumption and the energy saving entering time, the energy saving effect is increased through the control of the energy saving entering time period such that based on the above-mentioned relationship between the average power consumption and the energy saving entering time, the average power consumption in the normal operation mode or in the measurement mode ON, obtained in the third or fourth embodiment, is reflected in the energy saving entering time period. Therefore, in the third or fourth embodiment, an operation flow of FIG. 9 described below may be carried out additionally.

Figure 9:
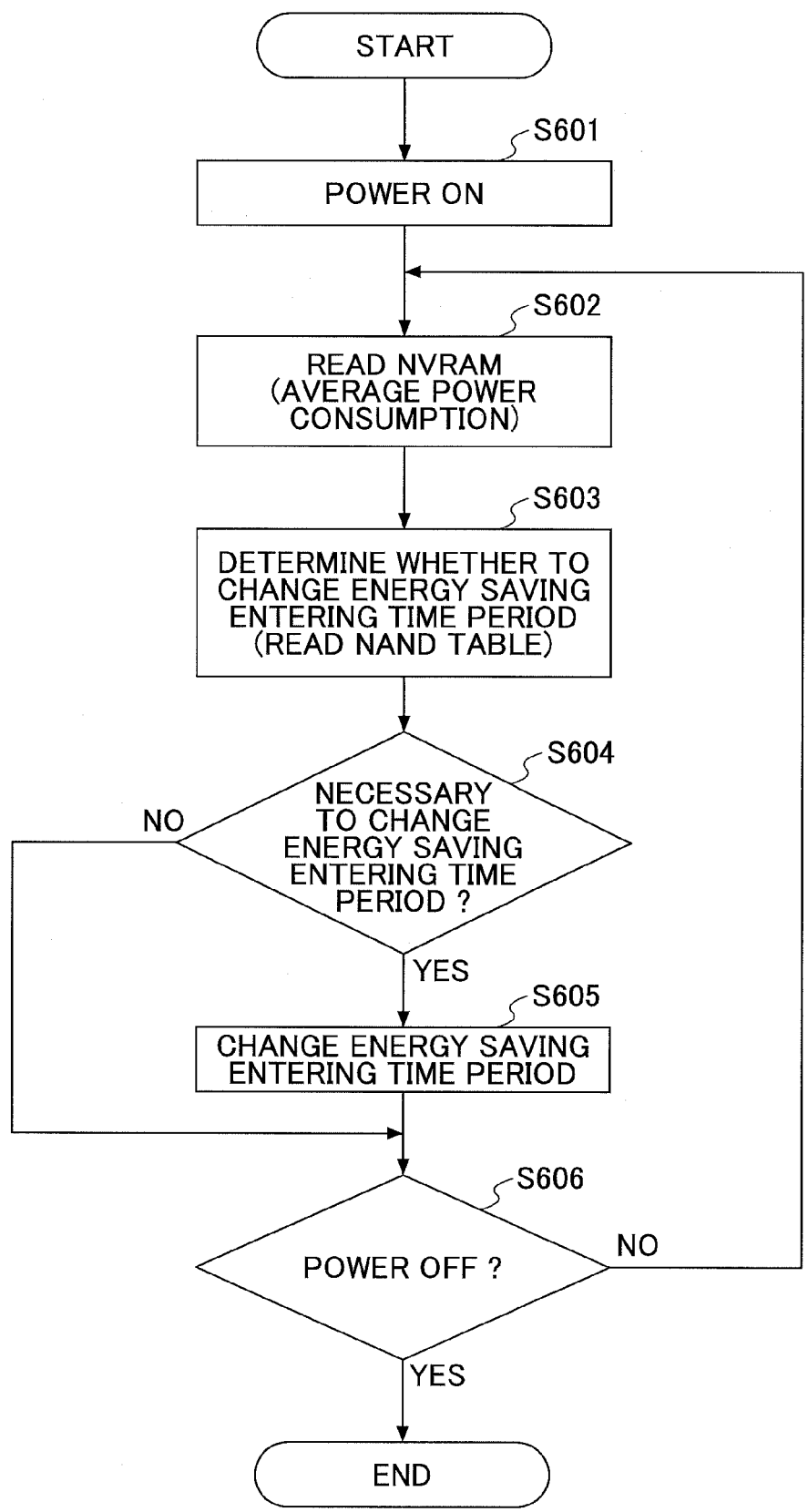
FIG. 9 shows a flowchart showing one example of an operation flow of a sequence of changing an energy saving entering time period according to the average power consumption, according to a fifth embodiment of the image processing apparatus.

FIG. 9 shows the operation flow concerning a sequence of changing the energy saving entering time based on the average power consumption.

It is noted that in the operation flow of FIG. 9, the operation flow after the power supply is turned on in the MFP 100 and before the power supply is turned off in the MFP 100 (steps S602 through S606) is repeated, from the power supply to the controller 110 being started to the power supply being turned off in the MFP 100 in the operation flow of FIG. 2.

The flow of FIG. 9 is carried out preferably each time when the average power consumption in the normal operating condition or in the measurement mode ON is obtained. For example, the flow of FIG. 9 is carried out preferably in addition, as in step S507C of the flow of FIG. 7 (fourth embodiment), when the average power consumption is written to the NVRAM 115 and thus the new data to be used is generated. Therefore, in the case where the flow of FIG. 9 is carried out in the third embodiment, a process of writing the average power consumption calculated in step S406B in the NVRAM 115 is additionally carried out.

According to the flow of FIG. 9, the ASIC (2) 112 starts the control of the flow of FIG. 9 (step S601) under the condition where the ASIC (2) 112 enters the state of being able to operate because the power is turned on in the MFP 100 and the average power consumption has been obtained in the power consumption calculation and displaying process having been carried out previously. First, the ASIC (2) 112 reads the written average power consumption from the NVRAM 115 and thus obtains the average power consumption at the present time (step S602).

Next, the ASIC (2) 115 determines based on the obtained average power consumption whether to change the energy saving time period having been set (step S603). Thus, the ASIC (2) 112 acts as one example of an entering time period change necessity determination part.

This determination is to determine whether to change the energy saving entering time period by determining which range of predetermined plural ranges that have been divided previously by a value(s) of the power the obtained average power consumption belongs to, obtaining the energy saving entering time period corresponding to the determined range and determining whether the obtained energy saving entering time period is different from the energy saving entering time period that has been set. FIG. 10 shows one example of a table (referred to as an "average power consumption—energy saving entering time period table") to be used in the determination. In this table, power is divided into a range of the average power consumption not exceeding a predetermined value (XXW) and a range of the average power consumption exceeding the predetermined value, and the corresponding energy saving entering time periods (in this example, the former being 5 minutes and the latter being 1 minute) are given, respectively. It is noted that the above-mentioned average power consumption—energy saving entering time period table is obtained for each particular product of the MFP 100 in consideration of adaptability and is previously stored in the NAND type flash memory 116, for example.

Thus, the average power consumption obtained in step S602 is compared with the predetermined value (XXW), it is determined which range the average power consumption belongs to, and according to the determination result, the corresponding energy saving entering time period suitable for the current state is obtained based on the average power consumption—energy saving entering time period table. Further, the obtained energy saving entering time period is compared with the energy saving entering time period having been set, and through determination as to whether these energy saving entering time periods are different from one another, it is determined whether the energy saving entering time period is to be changed (steps S603, S604).

Next, when it is not necessary to change the setting of the energy saving entering time period (step S604—NO), the ASIC (2) 112 does nothing. On the other hand, when it is necessary to change the setting of the energy saving entering time period (step S604—YES), the ASIC (2) 112 sets the obtained energy saving entering time period by replacing the existing energy saving entering time period (step S605).

After that, the ASIC (2) 112 determines in step S606 whether the power turning off request is generated. When the power turning off request is generated (step S606—YES), the process of FIG. 9 is finished.

On the other hand, when no power off request is generated (step S606—NO), the ASIC (2) 112 returns to step S602 of reading the NVRAM 115 in which the average power consumption has been written, for carrying out again the process concerning the change of the energy saving entering time period, and repeats the control operation starting from step S602.

[AC Power Source Connection Part]

Below, a sixth embodiment of the present invention will be described. The sixth embodiment is the same as the above-described first embodiment except for the configuration described below. Duplicate description will be omitted as is appropriate for the parts/components corresponding to those of the first embodiment.

The sixth embodiment is an embodiment in which, as an AC power source connection part in the MFP 100 according to the first embodiment, a replaceable part is used. It is noted that the AC power source connection part is one example of a power source connection part, and is a connection part, belonging to the MFP 100, concerning a connection between the connection part 170 and the MFP 100. Specifically, the AC power source connection part is a part including a socket (R1) that the MFP 100 has. That is, in this case, as shown in FIG. 11, the connection part 170 includes a plug P1 that is to be put into the commercial power source (for example, wall outlet or such, not shown), another plug (not shown) that is to be put into the socket R1 belonging to the MFP 100 and a wire W1 connecting both plugs.

As the AC power source connection part, according to the sixth embodiment, two types are prepared. One type of the AC power source connection part (162) is such that the power measurement Md 160 is provided and another type (162') is such that the power measurement Md 160 is not provided. The user can select either of the two types of the AC power source connection parts 162 and 162', and mount the selected one in the MFP 100. Thus, according to the user's request or depending on the operating conditions of the MFP 100, the user can select to use the type of the AC power source connection part 162' not including the power measurement Md 160 for a case where using the power measurement Md 160 is not so advantageous on a cost/performance basis, for example.

Figure 11:
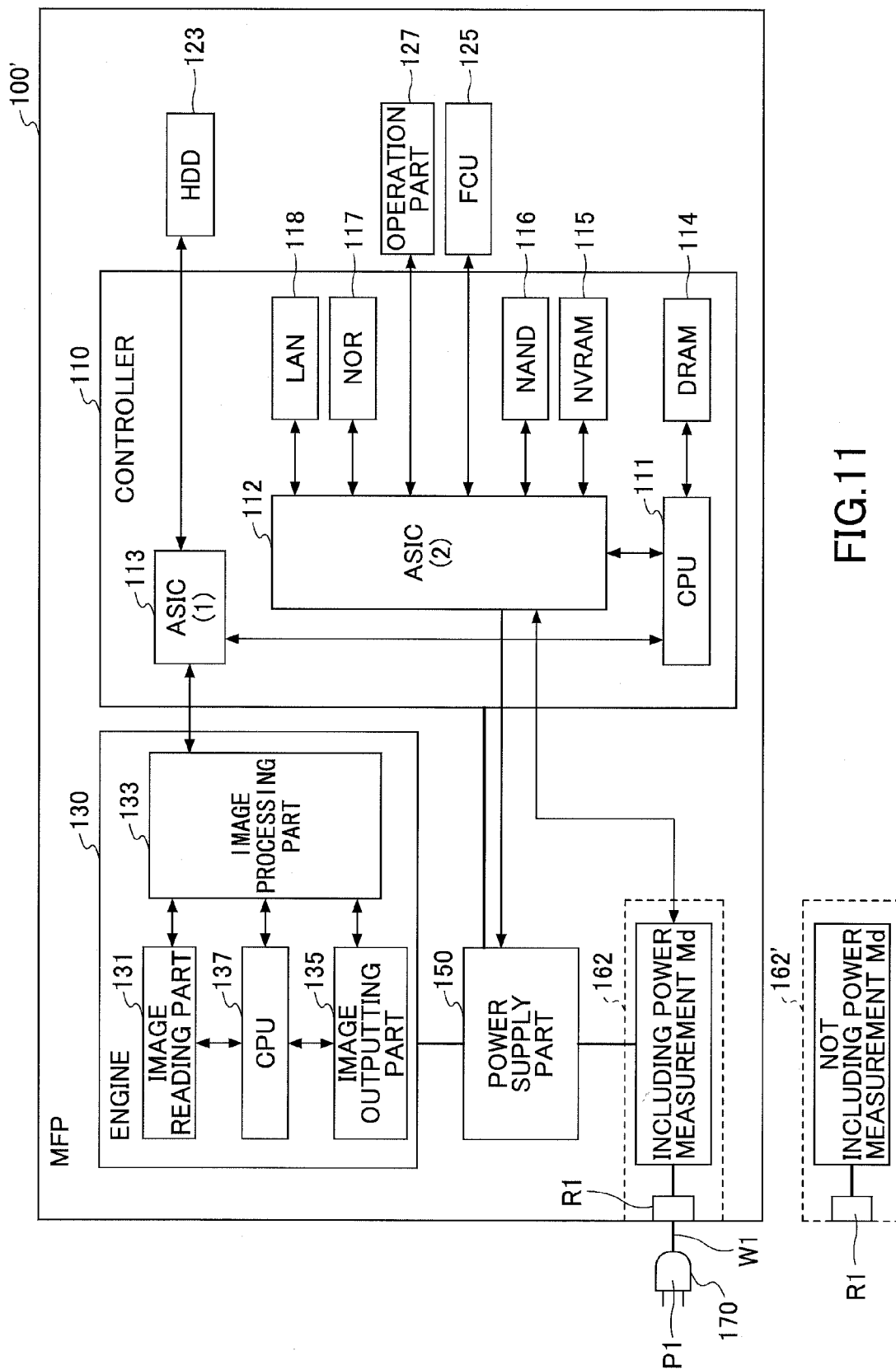
FIG. 11 generally shows a hardware configuration of an MFP according to a sixth embodiment of the image processing apparatus in which two types of an AC power source connection part that has a power consumption measurement function and another AC power source connection part that does not have the power consumption measurement function are selectively used as replacement parts in the MFP shown in FIG. 11.

FIG. 11 generally shows one example of a hardware configuration of an MFP 100' according to the sixth embodiment.

The MFP 100' according to the sixth embodiment shown in FIG. 11 is such that, in the MFP 100 shown in FIG. 1, the two types of AC power source connection parts 162 and 162', including the power measurement Md 160 and not including the same, are usable as replaceable parts.

It is noted that the MFP 100' shown in FIG. 11 is the same as the MFP 100 shown in FIG. 1 except for the AC power source connection parts 162, 162' being used, the same reference numerals are given to the same parts/components as those of the MFP 100 of FIG. 1, and duplicate description will be omitted as is appropriate.

Figure 12:
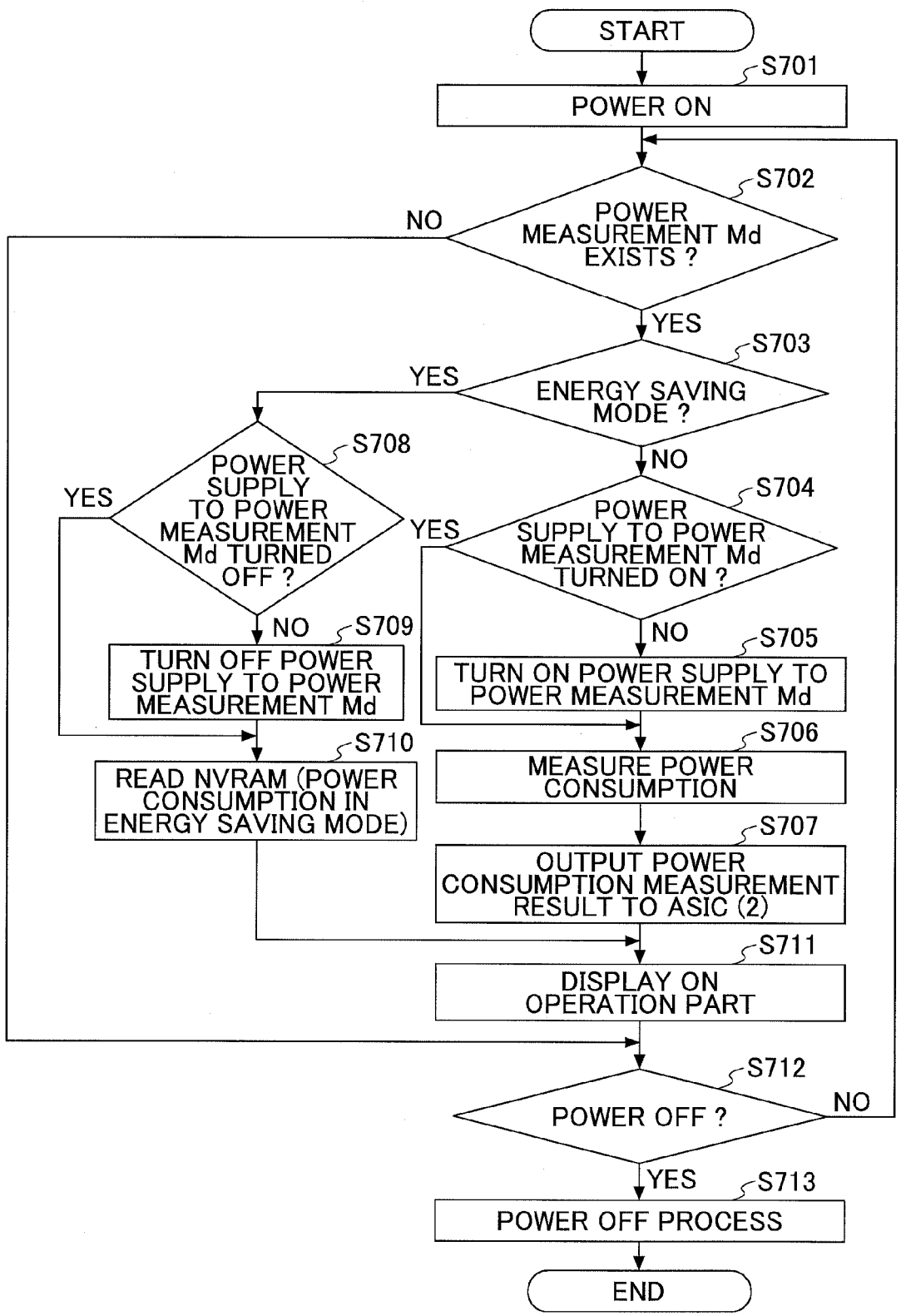
FIG. 12 is a flowchart showing one example of an operation flow of a power consumption calculation and displaying sequence carried out by the MFP shown in FIG. 11.

FIG. 12 shows an operation flow of a power consumption calculation and displaying sequence of the MFP 100' according to the sixth embodiment shown in FIG. 11.

The flow of FIG. 12 is the same as the flow of FIG. 3 except for the two types of the AC power source connection parts 162 and 162' respectively including and not including the power measurement Md 160 being used as replaceable parts. In order to adapt to the state where either of the two types of the AC power source connection parts 162 and 162' is mountable, step S702 is added. The rest of the configuration is the same as the flow of FIG. 3. Steps S701, S703, S704, S705, S706, S707, S708, S709, S710, S711, S712 and S713 of FIG. 12 correspond to steps S201, S202, S203, S204, S205, S206, S207, S208, S209, S210, S211 and S212, respectively.

In the flow of FIG. 12, the ASIC (2) 112 starts the control according to the flow of FIG. 12 upon being able to operate as a result of power being turned on in the MFP 100' (step S701). First, the ASIC (2) 112 determines whether the MFP 100' has the power measurement Md 160 (step S702). That is, the ASIC (2) 112 determines which one of the AC power source connection parts 162 and 162' is used in the MFP 100'. A specific method of the determination of the in-use AC power source connection part 162 or 162' may be such that the controller 110 stores current configuration information of the MFP 100' in the NVRAM 115 for example, manages the configuration information, and, from the configuration information, determines which one of the AC power source connection parts 162 and 162' is being used in the MFP 100'.

Alternatively, each of the AC power source connection parts 162 and 162' may output a Md possession signal, which indicates whether the AC power connection part has the power measurement Md 160, to the ASIC (2) 112 when being mounted in the MFP 100'. Then, the ASIC (2) 112 may determine, based on the Md possession signal, whether the AC power source connection part, currently mounted in the MFP 100', has the power measurement Md 160.

When the AC power source connection part currently mounted in the MFP 100' has the power measurement Md 160 (step S702—YES), the power consumption calculation and displaying sequence starting from step S703 is carried out. Since the power consumption calculation and displaying sequence starting from step S703 is the same as the power consumption calculation and displaying sequence starting from step S202 in the flow of FIG. 3, duplicate description will be omitted.

On the other hand, when the AC power source connection part currently mounted in the MFP 100' does not have the power measurement Md 160 (step S702—NO), the power consumption calculation and displaying sequence starting from step S703 is not carried out, and the process proceeds to step S712 of determining whether the power turning off request is generated.

The flow starting from step S712 is basically the same as the flow starting from step S211 of FIG. 3. However, the destination of returning for the repetition, when the power turning off request is not generated (step S712—NO), is step S702 of determining whether the MFP 100' has the power measurement Md 160.

It is noted that with reference to FIG. 12, the example that is based on the flow of FIG. 3 has been described. However, it is also possible to adapt any other operation flow, for example, any one of the operation flows of power consumption calculation and display sequences shown in FIGS. 4, 6 and 7, to the state where either of the two types of the AC power source connection parts 162 and 162' is mountable.

Specifically, for example, in the case of the flow of FIG. 4, the above-mentioned step S702 may be inserted between step S301 and S302; step S302 may be proceeded to when a determination result of step S702 is YES; step S312 may be proceeded to when the determination result of step S702 is NO; and the destination of returning, when a determination result of step S312 is NO, may be step S702.

In the case of the flow of FIG. 6, the above-mentioned step S702 may be inserted between step S401 and S402; step S402 may be proceeded to when a determination result of step S702 is YES; step S411 may be proceeded to when the determination result of step S702 is NO; and the destination of returning, when a determination result of step S411 is NO, may be step S702.

In the case of the flow of FIG. 7, the above-mentioned step S702 may be inserted between step S501 and S502; and step S502 may be proceeded to when a determination result of step S702 is YES. Further, in this case, step S513', the same as step S513, is provided separately. Then, step S513' may be proceeded to when the determination result of step S702 is NO; step S516 may be proceeded to when a determination result of step S513' is YES, and the destination of returning, when the determination result of step S513' is NO, may be step S702.

[Flow of Energy Saving Entering and Returning to Normal Operation Mode]

Next, with reference to FIG. 13, a flow of operation of energy saving entering and returning to the normal operation mode will be described.

Figure 13:
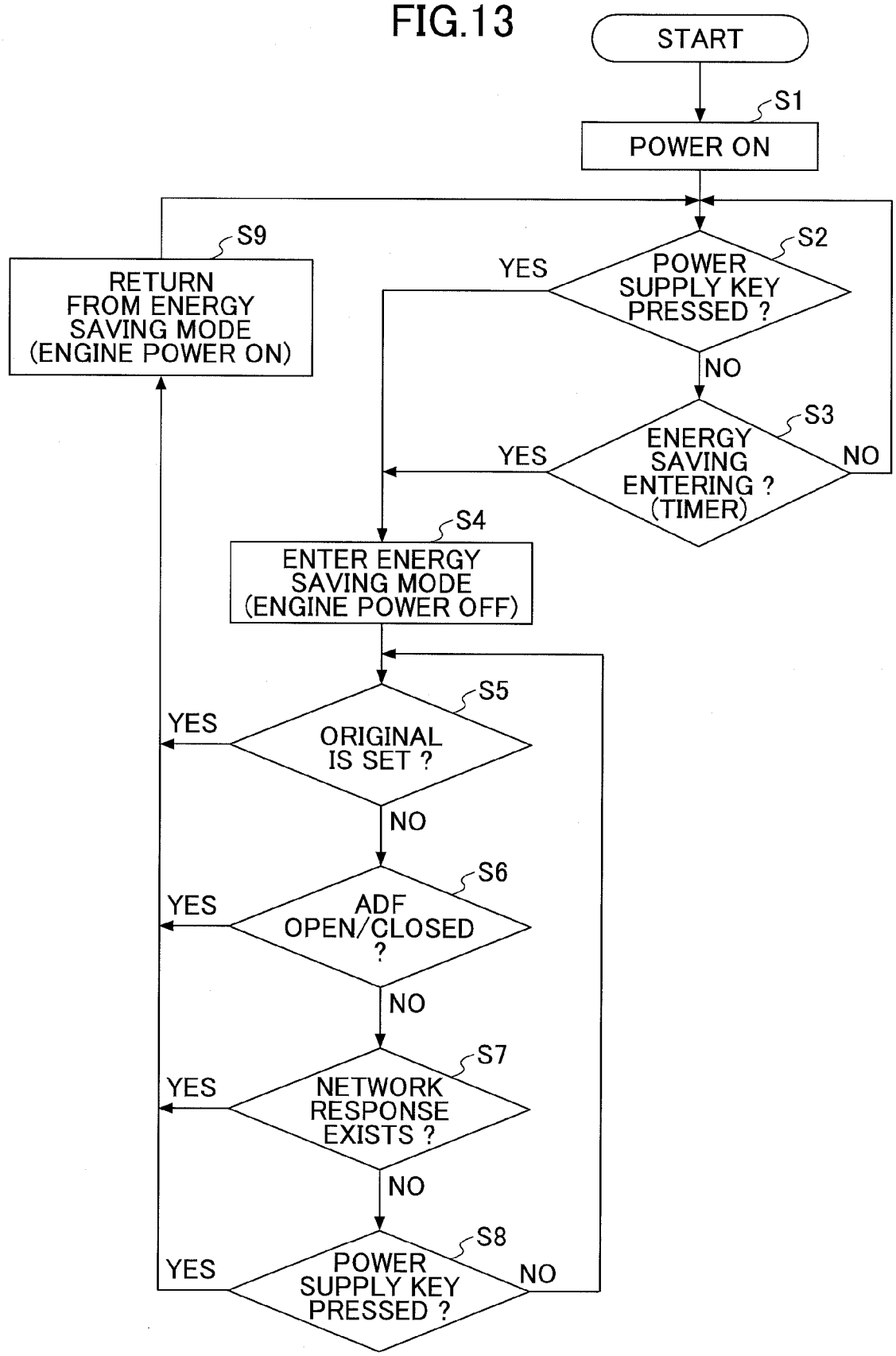
FIG. 13 is a flowchart showing one example of an operation flow of an operation of entering an energy saving operation mode and returning from the energy saving operation mode to a normal operation mode.

The flow of FIG. 13 may be used in any one of the above-described first through fifth embodiments, and the flow after the power is turned on in the MFP (step S2 through S9) is carried out from when the power is supplied to the controller 110 in the flow of FIG. 2 to when the power is turned off in the MFP.

In the flow of FIG. 13, when the power is turned on in the MFP (step S1) and the controller 110 thus can operate, the ASIC (2) 112 determines whether the power supply key 129 (see FIGS. 5A, 5B) is pressed (step S2). When the power supply key 129 is pressed (step S2—YES), the ASIC (2) 112 carries out energy saving entering (step S3). That is, the ASIC (2) 112 gives an instruction to the power supply part 150, and causes the power supply part 150 to stop the power supply to the engine 130.

Next, in step S5, the ASIC (2) 112 determines whether an original is set on the image reading part 131 (see FIG. 1 or 11). It is noted that "an original being set on the image reading part 131" means that, for example, an original is set on an ADF (Automatic Document Feeder) (not shown) of the image reading part 131. The ADF is such a device that the ADF is provided on a contact glass (not shown) of the image reading part 131; therefore, as the user merely sets plural sheets of the original on the ADF, the original is automatically fed, sheet by sheet, onto the contact glass, and thus, the plural sheets of the original are automatically read by the image reading part 131, sheet by sheet. Further, the image reading part 131 emits light onto the original that is set on the contact glass through the contact glass, and reads an image of the original by receiving the reflected light from the original. The image reading part 131 has a sensor (not shown) that detects that the original is set on the ADF, and the ASIC (2) 112 determines whether an original is set on the image reading part 131 from an output signal of the sensor.

When no original is set on the image reading part 131 (step S5—NO), step S6 is proceeded to, and it is determined whether the ADF of the image reading part 131 is opened or closed. It is noted that the user can directly set an original on the contact glass after opening the ADF and thus exposing the contact glass. The image reading part 131 has a sensor that detects that the ADF is opened, and the ASIC (2) 112 determines whether the ADF is opened or closed from an output signal of the sensor.

When the ADF is neither opened nor closed (step S6—NO), step S7 is proceeded to, and the ASIC (2) 112 determines whether a network response has occurred. The network response means, for example, that a signal requesting execution of a job is received by the MFP 100 or 100' from the outside through the LAN I/F 118 (see FIG. 1 or 11).

When no network response has occurred (step S7—NO), step S8 is proceeded to, and the ASIC (2) 112 determines whether the power supply key 119 is pressed.

When the power supply key 119 is not pressed (step S8—NO), the ASIC (2) 112 returns to step S5.

On the other hand, when an original is set (step S5—YES), when the ADF is opened or closed (step S6—YES), when a network response has occurred (step S7—YES), or when the power supply key 119 is pressed (step S8—YES), the ASIC (2) 112 proceeds to step S9.

In step S9, the ASIC (2) 112 causes the MFP to return to the normal operation mode. That is, the ASIC (2) 112 gives an instruction to the power supply part 150, and causes the power supply part 150 to start the power supply to the engine 130. After that, step S2 is returned to.

Further, when the power supply key 129 is not pressed in step S2 (NO in step S2), the ASIC (2) 112 proceeds to step S3.

In step S3, the ASIC (2) 112 proceeds to step S4 when determining that the energy saving entering condition is met. The energy saving entering condition is, as mentioned above, such that in a state in which the MFP can carry out ordinary operations (i.e., in the normal operation state), a state where no change of a status of the MFP occurs continues for a time period that exceeds the energy saving entering time period. "A change of a status of the MFP" may be, for example, the user's input operation to the operation part 127, the user's setting an original in the MFP to be read, the user's coming to the MFP, or such, and in a broad sense, may be a change in a state of the MFP as an opportunity to carry out a process of a job such as a copying job. Alternatively, it may be determined that the energy saving entering condition is met and thus energy saving entering may be carried out (step S3—YES→step S4) when a state, where no original is set (step S5—NO), the ADF is neither opened nor closed (step S6—NO), no network response has occurred (step S7—NO), and also, the power supply key 119 is not pressed (step S8—NO), continues for a time period that exceeds the energy saving entering time period.

Further, as mentioned above, the energy saving entering time periods are stored in the NAND type flash memory 116 and registered in the average power consumption—energy saving entering time table (see FIG. 10). Alternatively, the energy saving entering time periods may be registered in the NVRAM 115 separately.

The control operations carried out by the ASIC (2) 112 according to the operation flows described above with reference to FIGS. 2, 3, 4, 6, 7, 9, 12 and 13 may be achieved by logic circuits of hardware of the ASIC (2) 112. Alternatively, the same control operations may be achieved as a result of the program stored in the NOR type flash memory 117 being executed by the CPU 111. Yet alternatively, part of the same control operations may be achieved by logic circuits of hardware of the ASIC (2) 112, and the other part of the same control operations may be achieved as a result of the program stored in the NOR type flash memory 117 being executed by the CPU 111.

[Example of Configuration of Power Measurement Md]

Next, with reference to FIG. 14, an example of a configuration of the power measurement Md 160 in each of the above-mentioned first through sixth embodiments will be described.

In the example of FIG. 14, the power measurement Md 160 includes an internal power supply part 161, a resistor 166, a voltage detection circuit 163, a current detection circuit 164, and an AD conversion and power consumption calculation part 165.

The internal power supply part 161 converts AC power supplied through the connection part 170 into DC power, and provides the DC power to the AD conversion and power consumption calculation part 165. Further, the internal power supply part 161 stops or starts the DC power supply to the AD conversion and power consumption calculation part 165 according to a power supply control signal output by the ASIC (2) 112. The power supply to the power measurement Md 160 being stopped (i.e., the power supply to the power measurement Md 160 being turned off) means the DC power supply to the AD conversion and power consumption calculation part 165 is turned off or stopped. Similarly, the power supply to the power measurement Md 160 being started (i.e., the power supply to the power measurement Md 160 being turned on) means the DC power supply to the AD conversion and power consumption calculation part 165 is started or turned on. The internal power supply part 161 outputs the ON/OFF notification signal to the ASIC (2) 112. The ON/OFF notification signal indicates that the power supply to the power measurement Md 160 is stopped (i.e., the power supply is turned off) in the state where the DC power supply to the AD conversion and power consumption calculation part 165 is stopped. The ON/OFF notification signal indicates that the power supply to the power measurement Md 160 is carried out (i.e., the power supply is turned on) in the state where the DC power supply to the AD conversion and power consumption calculation part 165 is carried out.

The voltage detection circuit 163 detects an AC voltage supplied through the connection part 170, and outputs the detection result to the AD conversion and power consumption calculation part 165. The current detection circuit 164 detects an AC current supplied through the connection part 170 based on a voltage value obtained from both ends of the resistor 166, and outputs the detection result to the AD conversion and power consumption calculation part 165.

The AD conversion and power consumption calculation part 165 converts the respective signals (i.e., the detection results) obtained from the voltage detection circuit 163 and the current detection circuit 164 into digital signals, calculates, based on the digital signals, power (i.e., power consumption) that is being supplied to the respective parts (including the engine 130 and the controller 110) in the MFP 100 or 100' through the power measurement Md 160, and outputs the calculated power consumption to the ASIC (2) 112 in a real-time manner. Further, in the third and fourth embodiments in which the average power consumption is calculated, the AD conversion and power consumption calculation part 165 further calculates the integral power consumption based on the calculated power consumption, and outputs the calculated integral power consumption to the ASIC (2) 112 in a real-time manner.

The present invention is not limited to the specifically disclosed embodiments, and variations and modifications may be made without departing from the scope of the present invention.

The present application is based on Japanese Priority Applications Nos. 2010-118600 and 2011-034071 filed on May 24, 2010 and Feb. 21, 2011, respectively, the entire contents of which are hereby incorporated herein by reference.

What is claimed is:

1. An image processing apparatus comprising:
   an action part that processes an image;
   a user interface part;
   a power measurement part that measures power consumed by the image processing apparatus;
   an internal power supply part that controls power supply to the power measurement part; and
   a control part that controls the action part and the user interface part, and controls power supply to the action part, wherein
   the control part outputs a control signal to the internal power supply part to control the power supply to the power measurement part independently from the power supply to the action part, and
   the control part obtains information of the power measured by the power measurement part and displays the information on the user interface part.

2. The image processing apparatus as claimed in claim 1, wherein
   the control part stops the power supply to the action part and the power measurement part in response to an instruction for a power saving operation, estimates power consumed by the image processing apparatus in a state where the power supply to the action part and the power measurement part is stopped, and displays the estimated power consumption on the user interface part.

3. The image processing apparatus as claimed in claim 1, wherein
   the control part includes an average power consumption calculation part that obtains average power consumption that is an average of power that the power measurement part measures, and displays the average power consumption obtained by the average power consumption calculation part on the user interface part.

4. The image processing apparatus as claimed in claim 3, wherein
   the control part includes a power measurement necessity determination part that determines whether to use the power measurement part according to whether the average power consumption obtained by the average power consumption calculation part is a value within a predetermined range, and
   the control part controls the power supply to the power measurement part according to a determination result of the power measurement necessity determination part as to whether to use the power measurement part.

5. The image processing apparatus as claimed in claim 3, wherein
   the control part includes
   a power saving operation entering part that causes the image processing apparatus to start to carry out the power saving operation in a case where a predetermined entering time period has passed in a state where the image processing apparatus meets a predetermined condition, and
   an entering time period change necessity determination part that determines whether to change the predetermined entering time period according to whether the average power consumption obtained by the average power computation calculation part is a value within a predetermined range, wherein
   the control part changes the predetermined entering time period when the entering time change necessity determination part determines to change the predetermined entering time period.

6. The image processing apparatus as claimed in claim 1, wherein
   the control part controls the power supply to the power measurement part in response to an instruction indicating whether to use the power measurement part.

7. The image processing apparatus as claimed in claim 1, wherein
   plural power source connection parts each of which connects the image processing part to a power source are replaceable, and any one of the plural power source connection parts which includes the power measurement part and another one which does not include the power measurement part is selectively used in the image processing apparatus.

8. The image processing apparatus as claimed in claim 1, wherein
   the user interface part includes an operation part and a display part, and
   an operation condition of the image processing apparatus is set by user input through the user interface part.

9. The image processing apparatus as claimed in claim 1, wherein the control part monitors the image processing apparatus for a predetermined energy saving entering condition, and when the energy saving entering condition is met, the control part stops the power supply to the action part.

10. The image processing apparatus as claimed in claim 1, wherein the power measurement part periodically measures integral power consumption to recalculate and store the average power consumption of the last periodic measurement.

11. The image processing apparatus as claimed in claim 1, wherein in at least some instances, the control part controls the power supply to the action part to supply power to the action part and control the internal power supply part not to supply power to the power measurement part.

12. A method of controlling an image processing apparatus that includes an action part that processes an image; a user interface part; a power measurement part that measures power consumed by the image processing apparatus; and an internal power supply part that controls power supply to the power measurement part, the method comprising:

controlling power supply to the action part, providing a control signal to the internal power supply part to control the power supply to the power measurement part independently from the power supply to the action part; and obtaining information of the power measured by the power measurement part and displaying the information on the user interface part.

13. A non-transitory computer readable information recording medium embodying a program which, when executed by a computer processor, performs a method of controlling an image processing apparatus that includes an action part that processes an image; a user interface part; a power measurement part that measures power consumed by the image processing apparatus; and an internal power supply part that controls power supply to the power measurement part, the method comprising:

controlling power supply to the action part;

providing a control signal to the internal power supply part to control the power supply to the power measurement part independently from the power supply to the action part; and obtaining information of the power measured by the power measurement part and displaying the information on the user interface part.

* * * * *